(12) United States Patent
Oosera et al.

(10) Patent No.: US 11,923,015 B2
(45) Date of Patent: Mar. 5, 2024

(54) SEMICONDUCTOR STORAGE DEVICE AND DATA ERASING METHOD

(71) Applicant: KIOXIA CORPORATION, Tokyo (JP)

(72) Inventors: Shinichi Oosera, Yokohama Kanagawa (JP); Sumito Ohtsuki, Yokohama Kanagawa (JP); Tomoki Higashi, Yokohama Kanagawa (JP); Yuki Soh, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 193 days.

(21) Appl. No.: 17/682,968

(22) Filed: Feb. 28, 2022

(65) Prior Publication Data

US 2023/0087334 A1 Mar. 23, 2023

(30) Foreign Application Priority Data

Sep. 21, 2021 (JP) .................... 2021-153539

(51) Int. Cl.
*G11C 16/16* (2006.01)
*G11C 16/04* (2006.01)

(52) U.S. Cl.
CPC .......... *G11C 16/16* (2013.01); *G11C 16/0483* (2013.01)

(58) Field of Classification Search
CPC . G11C 16/16; G11C 16/0483; G11C 11/5635; G11C 16/225; G11C 16/3445; G11C 29/021; G11C 29/023; G11C 29/028; G11C 29/50012; G11C 16/32; H10B 43/27

See application file for complete search history.

(56) References Cited

U.S. PATENT DOCUMENTS

| 10,056,153 B2 | 8/2018 | Umezawa |
| 10,199,116 B2 | 2/2019 | Shim et al. |
| 10,910,076 B2 | 2/2021 | Yang |
| 2011/0063914 A1* | 3/2011 | Mikajiri ............ G11C 5/02 365/185.15 |
| 2012/0206972 A1 | 8/2012 | Shiino et al. |
| 2019/0088342 A1* | 3/2019 | Shimura ............ G11C 16/16 |
| 2019/0392904 A1* | 12/2019 | Park ............ G11C 16/32 |

FOREIGN PATENT DOCUMENTS

| JP | 2012169020 A | 9/2012 |
| JP | 2018085160 A | 5/2018 |
| JP | 6832461 B2 | 2/2021 |

* cited by examiner

*Primary Examiner* — Jerome Leboeuf
(74) *Attorney, Agent, or Firm* — Kim & Stewart LLP

(57) ABSTRACT

According to one embodiment, a semiconductor storage device includes strings each with a first select transistor, memory cell transistors, and a second select transistor connected in series. Word lines are provided, each connected to memory cell transistors in a same position across the strings. A bit line is connected in common to a first end of each of the strings. A source line is connected in common to a second end of each of the strings. A control circuit is configured to perform an erase operation on strings. The control circuit adjusts, for each of the strings, either an application time of a first voltage applied to a gate of the first select transistor of the respective string in the erase operation or a voltage level of the first voltage applied to the gate of the first select transistor of the respective string in the erase operation.

20 Claims, 17 Drawing Sheets

SEMICONDUCTOR STORAGE DEVICE AND DATA ERASING METHOD

CROSS-REFERENCE TO RELATED APPLICATION(S)

This application is based upon and claims the benefit of priority from Japanese Patent Application No. 2021-153539, filed Sep. 21, 2021, the entire contents of which are incorporated herein by reference.

FIELD

Embodiments described herein relate generally to a semiconductor storage device and a data erasing method for data in a semiconductor storage device.

BACKGROUND

In a semiconductor storage device, such as a NAND-type memory, due to the demand of miniaturization and large capacity, three-dimensional structuring has come to be used. In this kind of NAND-type memory, memory cell transistors may be configured as not only a single level cell (SLC) capable of storing 1-bit (2 values) data, but also a multi-level cell (MLC) capable of storing 2-bit (4 values) data, a triple level cell (TLC) capable of storing 3-bit (8 values) data, or a quad level cell (QLC) capable of storing 4-bit (16 values) data.

Data erasure for such a NAND-type memory is performed on a block-by-block basis. There is a demand to improve the erasure characteristic in order to make the characteristics of the NAND-type memory uniform.

DETAILED DESCRIPTION

Embodiments provide a semiconductor storage device and a data erasing method which are capable of improving the erasure characteristic.

In general, according to one embodiment, a semiconductor storage device includes a plurality of strings each string including a first select transistor, a plurality of memory cell transistors, and a second select transistor connected in series. A plurality of word lines is provided, each word line connected to memory cell transistors in a same position across the plurality of strings. A bit line is connected in common to a first end of each of the plurality of strings. A source line is connected in common to a second end of each of the plurality of strings. A control circuit is provided to perform an erase operation on plurality of strings. The control circuit is configured to adjust, for each of the plurality of strings, either an application time of a first voltage applied to a gate of the first select transistor of the respective string in the erase operation or a voltage level of the first voltage applied to the gate of the first select transistor of the respective string in the erase operation.

Hereinafter, certain example embodiments of the present disclosure will be described with reference to drawings.

First Embodiment

In general, the first embodiment makes it possible to improve the erasure characteristic by separately adjusting the application period of an erase voltage for each string of memory cell transistors.

(Configuration of Memory System)

Figure 1:
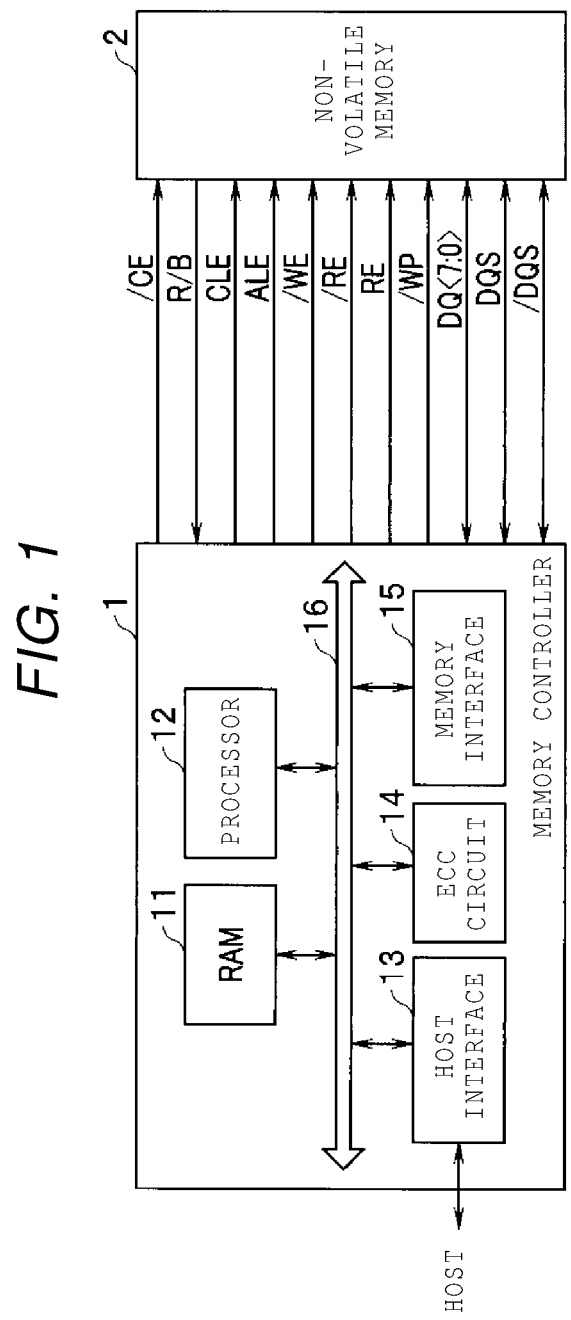
FIG. 1 is a block diagram of a memory system related to an embodiment.

FIG. 1 is a block diagram illustrating a configuration example of a memory system related to an embodiment. The memory system includes a memory controller 1 and a non-volatile memory 2. The memory system may be connected to a host. The host is, for example, an electronic device such as a personal computer or a mobile terminal.

The non-volatile memory 2 is a semiconductor storage device that stores data in a non-volatile manner, and is implemented as, for example, a NAND-type memory. In the first embodiment, the non-volatile memory 2 is a NAND memory having memory cell transistors each of which is capable of storing 3 bits, that is, a NAND memory of 3 bits/Cell (TLC) type, but is not limited thereto. The non-volatile memory 2 is three-dimensional in structure.

The memory controller 1 controls writing of data into the non-volatile memory 2 according to a write request from the host. The memory controller 1 controls reading of data from the non-volatile memory 2 according to a read request from the host. The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other via an internal bus 16.

The host interface 13 outputs a request, write data, or the like received from the host to the internal bus 16. The host interface 13 transmits data read from the non-volatile memory 2, a response from the processor 12, or the like, to the host.

The memory interface 15 controls processing of writing data or the like into the non-volatile memory 2, and processing of reading from the non-volatile memory 2, based on the instruction of the processor 12.

The processor 12 controls the memory controller 1 in a comprehensive manner. The processor 12 is, for example, a central processing unit (CPU), a micro processing unit (MPU) or the like. When a request is received from the host via the host interface 13, the processor 12 performs a control according to the request. For example, in response to a request from the host, the processor 12 instructs the memory interface 15 to write data and parity into the non-volatile memory 2. In response to a request from the host, the processor 12 instructs the memory interface 15 to read data and parity from the non-volatile memory 2.

The processor 12 determines a storage area (hereinafter, referred to as a memory area) on the non-volatile memory 2, for data stored in the RAM 11. The data is stored in the RAM 11 via the internal bus 16. The processor 12 performs determination of a memory area, for data per page, which is a writing unit, that is, page data. In this specification, data to be stored in one page of the non-volatile memory 2 is defined as unit data. For example, the unit data is encoded and is stored in the non-volatile memory 2 as a codeword.

The encoding is not essential. The memory controller 1 may store unit data in the non-volatile memory 2 without encoding, but FIG. 1 illustrates a configuration where encoding is performed as one configuration example. When the memory controller 1 does not perform encoding, page data is coincident with unit data. One codeword may be generated based on one unit data piece, or one codeword may be generated based on divided data in which unit data is divided. One codeword may be generated by using a plurality of unit data pieces.

The processor 12 determines a memory area of the non-volatile memory 2 as a write destination for each unit data piece. A physical address is allocated to the memory area of the non-volatile memory 2. The processor 12 manages the memory area as the write destination of unit data by using the physical address. The processor 12 specifies the physical address of the determined memory area and instructs the memory interface 15 to write data into the non-volatile memory 2. The processor 12 manages the correspondence between a logical address (that is, a logical address managed by the host) and a physical address of data. When a read request including a logical address is received from the host, the processor 12 identifies a physical address corresponding to the logical address, specifies the physical address, and instructs the memory interface 15 to read data.

The ECC circuit 14 encodes data stored in the RAM 11 to generate a codeword. The ECC circuit 14 decodes a codeword read from the non-volatile memory 2.

The RAM 11 temporarily stores data received from the host until the data is stored in the non-volatile memory 2, or temporarily stores data read from the non-volatile memory 2 until the data is transmitted to the host. The RAM 11 is, for example, a general purpose memory such as a static random access memory (SRAM) or a dynamic random access memory (DRAM).

FIG. 1 illustrates a configuration example in which the memory controller 1 includes the ECC circuit 14 and the memory interface 15. Alternatively, the ECC circuit 14 may be embedded in the memory interface 15. Further alternatively, the ECC circuit 14 may be embedded in the non-volatile memory 2.

When a write request is received from the host, the memory controller 1 operates as follows. The processor 12 temporarily stores write data in the RAM 11. The processor 12 reads the data stored in the RAM 11, and inputs the data to the ECC circuit 14. The ECC circuit 14 encodes the input data, and gives a codeword to the memory interface 15. The memory interface 15 writes the input codeword into the non-volatile memory 2.

When a read request is received from the host, the memory controller 1 operates as follows. The memory interface 15 gives a codeword read from the non-volatile memory 2, to the ECC circuit 14. The ECC circuit 14 decodes the input codeword, and stores the decoded data in the RAM 11. The processor 12 transmits the data stored in the RAM 11, to the host via the host interface 13.

(Schematic Configuration of Non-Volatile Memory)

Figure 2:
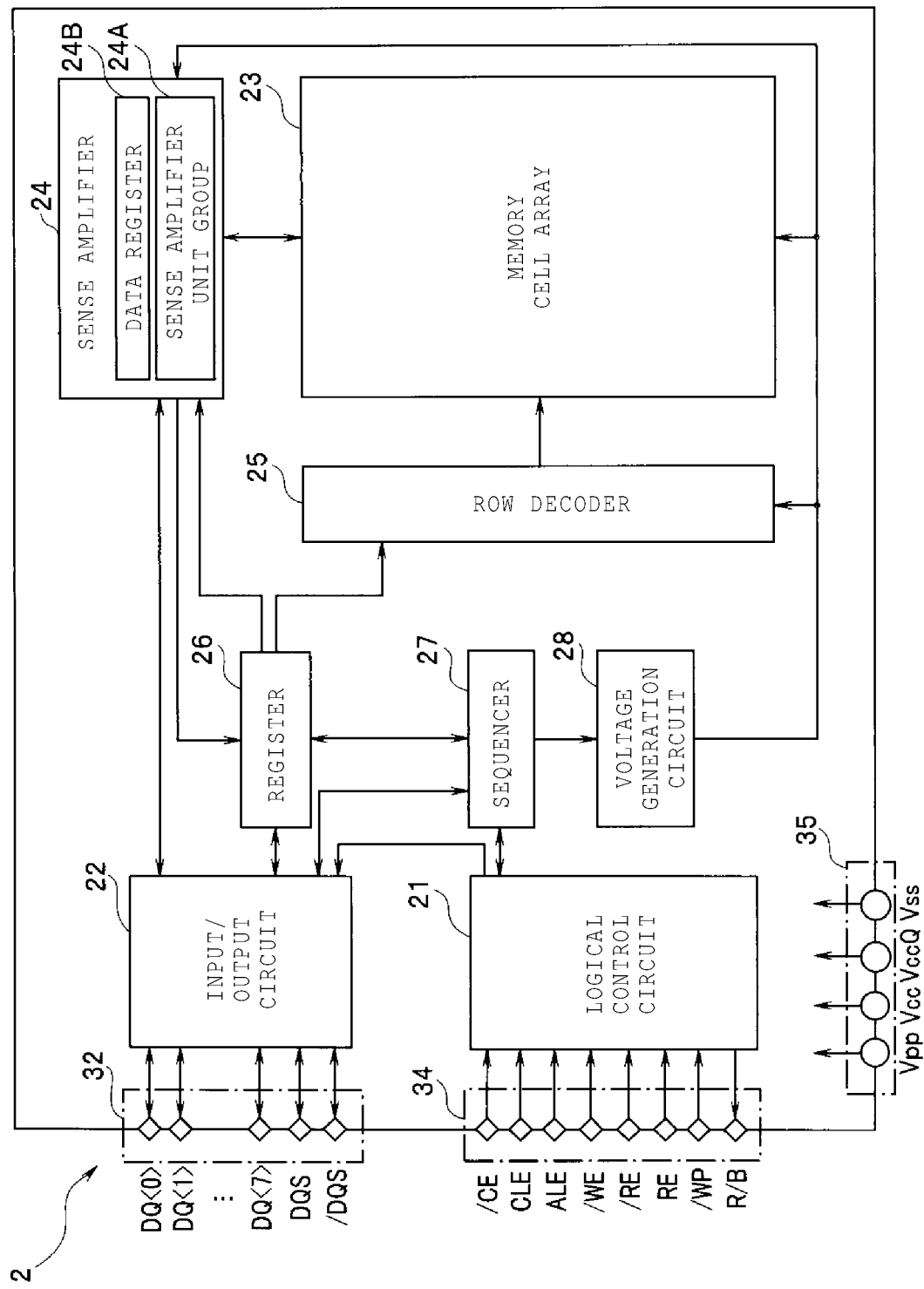
FIG. 2 is a block diagram of a non-volatile memory of an embodiment.

FIG. 2 is a block diagram illustrating a configuration example of the non-volatile memory of the present embodiment.

The non-volatile memory 2 includes a logical control circuit 21, an input/output circuit 22, a memory cell array 23, a sense amplifier 24, a row decoder 25, a register 26, a sequencer 27, a voltage generation circuit 28, an input/output pad group 32, a logical control pad group 34, and a power input terminal group 35.

The input/output pad group 32 includes a plurality of terminals (that is, pads) corresponding to signals DQ<7:0>, and data strobe signals DQS, and /DQS in order to transmit/receive each signal including data to/from the memory controller 1.

The logical control pad group 34 includes a plurality of terminals (that is, pads) corresponding to a chip enable signal /CE, a command latch enable signal CLE, an address latch enable signal ALE, a write enable signal /WE, read enable signals RE, and /RE, a write protect signal /WP, and a signal R/B, in order to transmit/receive each signal to/from the memory controller 1. The symbol "/" added to the signal name indicates "active low".

The signal /CE is a signal for selecting and enabling a specific memory chip when the non-volatile memory 2 includes a plurality of memory chips. The signal CLE makes it possible to latch a command transmitted as a signal DQ, in a command register. The signal ALE makes it possible to latch an address transmitted as a signal DQ, in an address register. The signal /WE enables writing. The signals RE and /RE enable reading. The signal /WP prohibits writing and erasing. The signal R/B indicates whether the non-volatile memory 2 is in a ready state (that is, a state where an instruction may be accepted from the outside) or a busy state (that is, a state where an instruction may not be accepted from the outside). By receiving the signal R/B, the memory controller 1 may know the state of the non-volatile memory 2.

The power input terminal group 35 includes a plurality of terminals to which power-supply voltages Vcc, VccQ, and Vpp, and a ground voltage Vss are input, so that various operating power sources are supplied to the non-volatile memory 2 from the outside. The power-supply voltage Vcc is a circuit power-supply voltage generally given from the outside, as an operating power source, and is, for example, a voltage of about 3.3 V. The power-supply voltage VccQ is, for example, a voltage of 1.2 V. The power-supply voltage VccQ is used when signals are transmitted/received between the memory controller 1 and the non-volatile memory 2. The power-supply voltage Vpp is a power-supply voltage higher than the power-supply voltage Vcc, and is, for example, a voltage of 12 V.

The logical control circuit 21 and the input/output circuit 22 are connected to the memory controller 1 via a NAND bus. The input/output circuit 22 transmits/receives signals DQ (for example, DQ0 to DQ7) to/from the memory controller 1 via the NAND bus.

The logical control circuit 21 receives external control signals (for example, the chip enable signal /CE, the command latch enable signal CLE, the address latch enable signal ALE, the write enable signal /WE, the read enable signals RE and /RE, and the write protect signal /WP) from the memory controller 1 via the NAND bus. The logical control circuit 21 transmits the ready/busy signal R/B to the memory controller 1 via the NAND bus.

The register 26 includes a command register, an address register, a status register and the like. The command register temporarily stores a command. The address register temporarily stores an address. The status register temporarily stores data required for the operation of the non-volatile memory 2. The register 26 is implemented by, for example, a SRAM.

The sequencer 27 has a register and may be referred to as a control circuit in some instances. The sequencer 27 receives a command from the register 26, and controls the non-volatile memory 2 according to a sequence based on the command.

The voltage generation circuit 28 receives power-supply voltages from the outside of the non-volatile memory 2, and uses the power-supply voltages to generate a plurality of voltages required for a write operation, a read operation, and an erase operation. The voltage generation circuit 28 supplies the generated voltages to the memory cell array 23, the sense amplifier 24, the row decoder 25, and the like.

The row decoder 25 receives a row address from the register 26, and decodes the row address. The row decoder 25 performs a selection operation of a word line based on the decoded row address. Then, the row decoder 25 transfers a plurality of voltages required for a write operation, a read operation, and an erase operation, to the selected block.

The sense amplifier 24 receives a column address from the register 26, and decodes the column address. The sense amplifier 24 has a sense amplifier unit group 24A connected to each bit line, and the sense amplifier unit group 24A selects any bit line based on the decoded column address. At reading of data, the sense amplifier unit group 24A detects and amplifies data read from the memory cell transistor to the bit line. At writing of data, the sense amplifier unit group 24A transfers write data to the bit line.

The sense amplifier 24 has a data register 24B. At reading of data, the data register 24B temporarily stores data detected by the sense amplifier unit group 24A, and serially transfers the data to the input/output circuit 22. At writing of data, the data register 24B temporarily stores data serially transferred from the input/output circuit 22, and transfers the data to the sense amplifier unit group 24A. The data register 24B is implemented by a SRAM or the like.

The memory cell array 23 includes a plurality of blocks BLK. Each of the plurality of blocks BLK includes a plurality of memory cell transistors (that is, memory cells). A plurality of bit lines, a plurality of word lines, a source line and the like are disposed in the memory cell array 23 so as to control voltages to be applied to the memory cell transistors.

(Block Configuration of Memory Cell Array)

Figure 3:
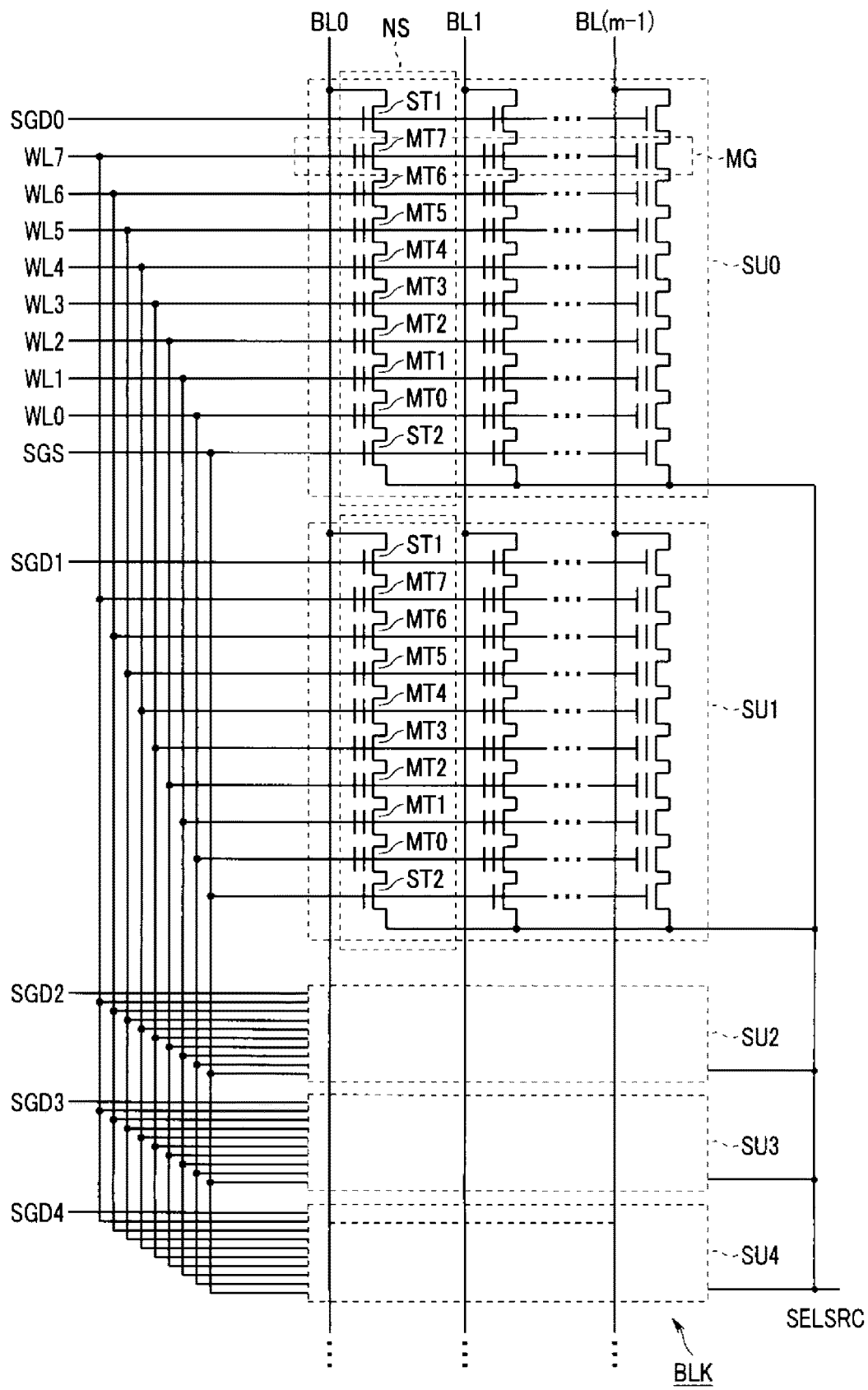
FIG. 3 depicts an equivalent circuit of a block of a NAND-type memory cell array having a three-dimensional structure.

FIG. 3 is a view illustrating an equivalent circuit of a block BLK of the NAND-type memory cell array 23 having a three-dimensional structure in the non-volatile memory 2 of the present embodiment. FIG. 3 illustrates one block BLK among a plurality of blocks constituting the memory cell array 23. Other blocks in the memory cell array also have the same configurations as that in FIG. 3. The present embodiment is also applicable to a memory cell array having a two-dimensional structure.

As illustrated, the block BLK includes, for example, five string units (that is, SU0 to SU4). The number of the strings is freely set according to a capacity and a chip size. In explaining this patent, as an example, five string units will be described. Each string unit SU includes a plurality of NAND strings NS. Here, each of the NAND strings NS includes eight memory cell transistors MT (that is, MT0 to MT7), and select gate transistors ST1 and ST2. Here, the number of the memory cell transistors MT provided in the NAND string NS is eight, but may be larger than eight. Each of the select gate transistors ST1 and ST2 is illustrated as one transistor on the electric circuit, but may be structurally the same as the memory cell transistor. A plurality of select gate transistors may be used for each of the select gate transistors ST1 and ST2. Further, a dummy cell transistor may be provided between the memory cell transistors MT and the select gate transistors ST1 and ST2.

The memory cell transistors MT are connected in series between the select gate transistors ST1 and ST2. The memory cell transistor MT7 on one end side (that is, the bit line side) is connected to the select gate transistor ST1, and the memory cell transistor MT0 on the other side (that is, the source line side) is connected to the select gate transistor ST2.

Gates of the select gate transistors ST1 in the string units SU0 to SU4 are connected to select gate lines SGD0 to SGD4 (hereinafter, these will be represented by select gate lines SGD), respectively. Meanwhile, gates of the select gate transistors ST2 are commonly connected to the same select gate line SGS among the plurality of string units SU in the same block BLK.

Gates of the memory cell transistors MT0 to MT7 in the same block BLK are commonly connected to word lines WL0 to WL7, respectively. That is, the word lines WL0 to WL7 are commonly connected among the plurality of string units SU0 to SU4 in the same block BLK, whereas the select gate lines SGD are independently set for the string units SU0 to SU4, respectively, even in the same block BLK. Gates of memory cell transistors MTi present in the same row in the block BLK are connected to the same word line WLi. In the following description, the NAND string NS may be simply referred to as a "string" in some cases.

Each NAND string NS is connected to a corresponding bit line. Therefore, each memory cell transistor MT is connected to the bit line through the select gate transistors ST1 and ST2 or other memory cell transistors MT provided in the NAND string NS. Data pieces of the memory cell transistors MT in the same block BLK are erased at once. Meanwhile, reading and writing of data are performed at once for the plurality of memory cell transistors MT commonly connected to one word line WL arranged in one string unit SU. Such a set including the memory cell transistors MT sharing the word line WL in one string unit SU is called a memory cell group MG.

A write operation and a read operation for the memory cell group MG are executed on a page-by-page basis. For example, when each cell is a TLC capable of storing 3-bit data (8 values), one memory cell group MG may store data for three pages. 3 bits that each memory cell transistor MT may store correspond to these three pages, respectively.

(Three-Dimensional Structure of Memory Cell Array)

Figure 4:
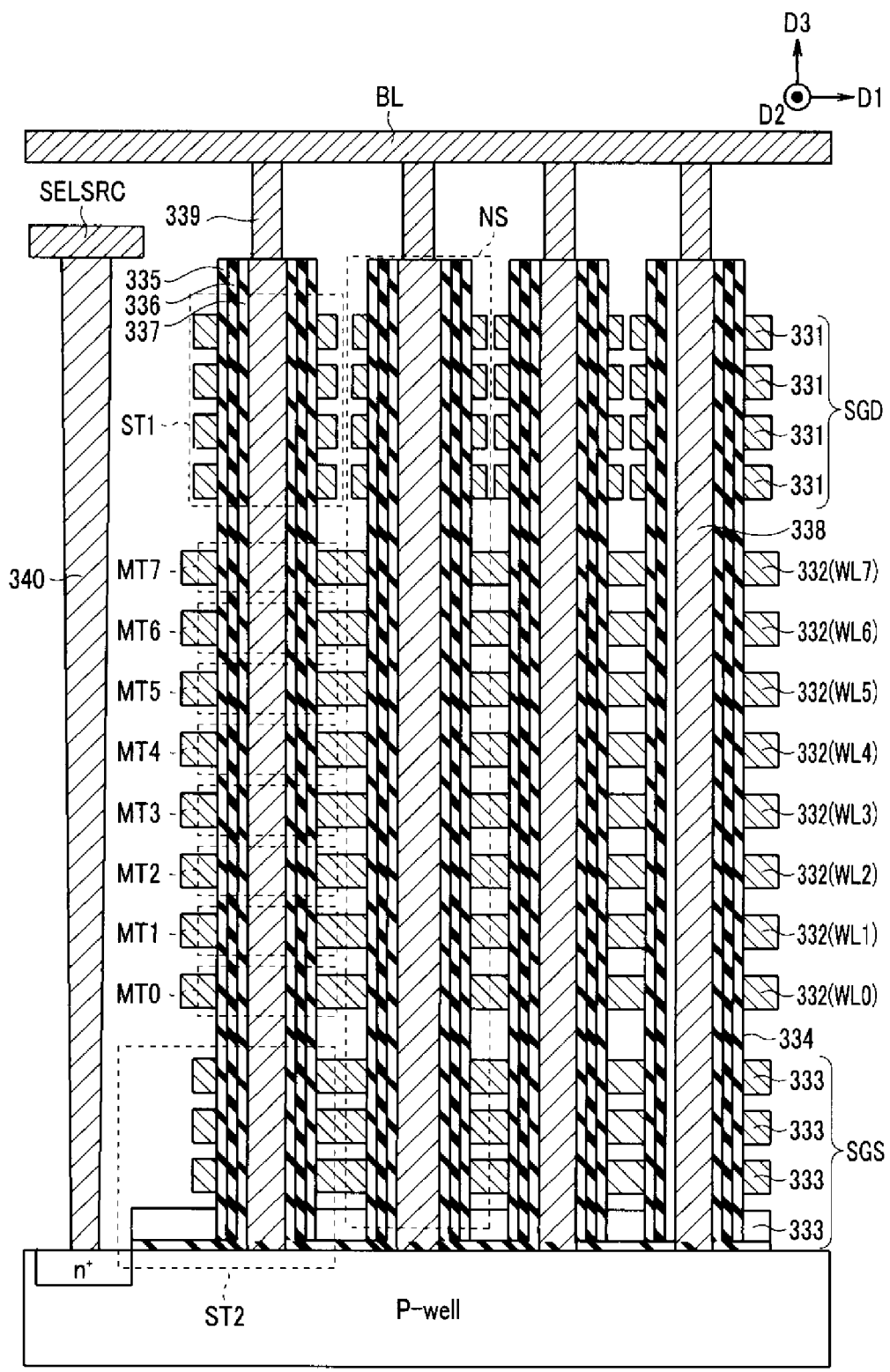
FIG. 4 is a cross-sectional view of a part of a NAND memory cell array.

FIG. 4 is a sectional view of a part of an area of the NAND memory cell array having a three-dimensional structure. As illustrated in FIG. 4, a plurality of NAND strings NS is formed in the D1 direction on a p-type well region (P-well). That is, on the p-type well region, a plurality of wiring layers 333 functioning as the select gate line SGS, a plurality of wiring layers 332 functioning as the word lines WLi, and a plurality of wiring layers 331 functioning as the select gate line SGD are stacked.

Then, a memory hole 334 is formed through these wiring layers 333, 332, and 331 while reaching the p-type well region. A block insulating film 335, a charge storage film (that is, a charge storage region) 336, and a gate insulating film 337 are sequentially formed on the side surface of the memory hole 334, and further, a semiconductor pillar 338 is embedded in the memory hole 334. The semiconductor pillar 338 is made of, for example, polysilicon, and functions as a region in which a channel is formed during operations of the memory cell transistors MT and the select gate transistors ST1 and ST2 provided in the NAND string NS. That is, the wiring layers 331, the semiconductor pillar 338, and the films 335 to 337 between them function as each select gate transistor ST1, the wiring layer 332, the semiconductor pillar 338, and the films 335 to 337 between them function as each memory cell transistor MT, and the wiring layers 333, each semiconductor pillar 338, and the films 335 to 337 between them function as the select gate transistor ST2.

In the illustration of FIG. 4, the memory hole 334 and the semiconductor pillar 338 have a cylindrical shape having the same diameter but in actuality, have a tapered shape whose diameter is reduced toward the p-type well region. Depending on the manufacturing process, the memory hole 334 and the semiconductor pillar 338 may have a multiple-stage tapered shape in which the diameter is expanded in the middle of the tapered shape and is reduced again toward the p-type well region.

In each NAND string NS, the select gate transistor ST2, the plurality of memory cell transistors MT, and the select gate transistor ST1 are formed in this order on the p-type well region. Above the semiconductor pillar 338 (in the D3 direction), a wiring layer functioning as a bit line BL is formed. A contact plug 339 that connects the semiconductor pillar 338 to the bit line BL is formed on the upper end of the semiconductor pillar 338.

Further, an n+ type impurity diffusion layer and a p+ type impurity diffusion layer are formed inside the surface of the p-type well region. A contact plug 340 is formed on the n+ type impurity diffusion layer, and a wiring layer functioning as a source line SELSRC is formed on the contact plug 340.

A plurality of configurations illustrated as above in FIG. 4 is arranged in the depth direction (in the D2 direction) of the sheet surface of FIG. 4, and one string unit SU is formed by a set including the plurality of NAND strings aligned in a row in the depth direction.

(Configuration of String)

Figure 5:
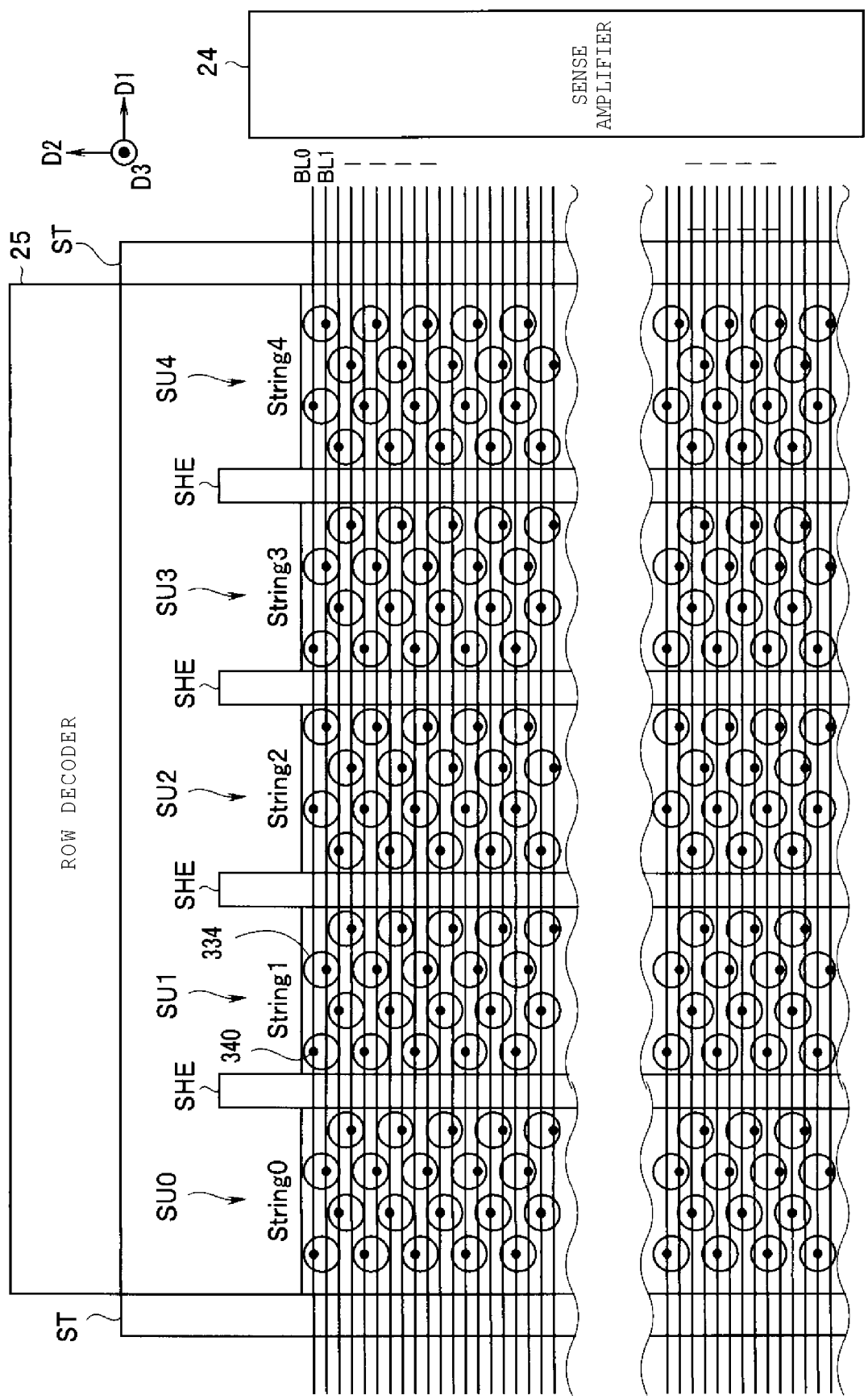
FIG. 5 is an explanatory view of an arrangement of each NAND string in a block.

FIG. 5 is an explanatory view illustrating the arrangement of each NAND string in one block BLK. The circle mark in FIG. 5 indicates the memory hole 334 constituting the NAND string. An insulating layer ST separates one block BLK illustrated in FIG. 5 from another block BLK. The example of FIG. 5 illustrates an example in which five string units SU0 to SU4 separated by insulating layers SHE are provided in one block BLK. The insulating layers SHE extend to the wiring layers 331 constituting the select gate lines SGD, and separate the string units SU0 to SU4 from each other.

It is assumed that each NAND string provided in the string unit SU0 in FIG. 5 is a String0, each NAND string provided in the string unit SU1 is a String1, each NAND string provided in the string unit SU2 is a String2, each NAND string provided in the string unit SU3 is a String3, and each NAND string provided in the string unit SU4 is a String4.

The plurality of memory holes 334 constituting the NAND strings is arranged in a string unit SU, and the memory holes 334 in each string unit are connected to bit lines by contact plugs 339. The bit lines are individually connected to each of the five strings (String0 to String4). Each string unit SU has m total NAND strings corresponding to bit lines BL0 to BL(m−1), respectively.

(Sense Amplifier)

Figure 6:
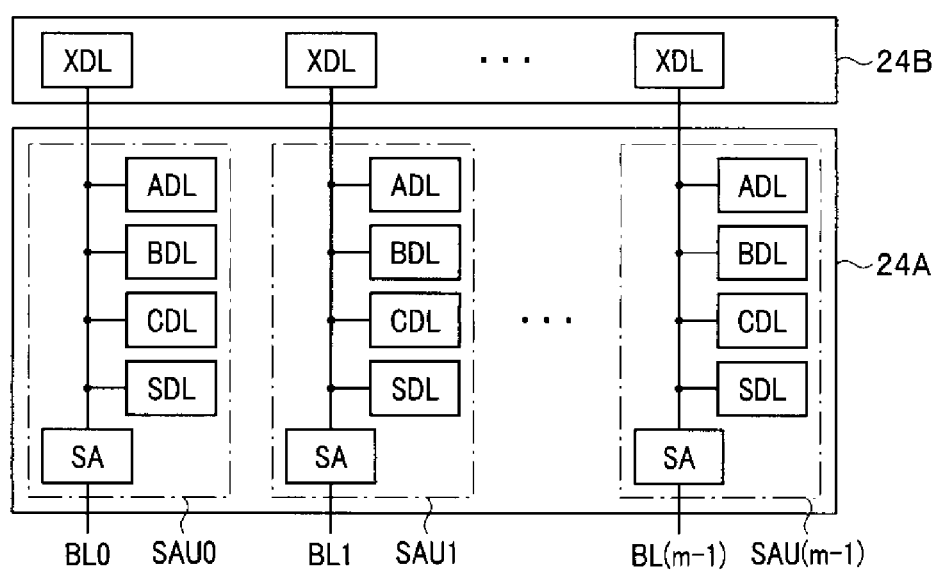
FIG. 6 is a block diagram of a sense amplifier.

FIG. 6 is a block diagram illustrating an example of the sense amplifier 24 in FIG. 2.

The sense amplifier 24 has the sense amplifier unit group 24A and the data register 24B. The sense amplifier unit group 24A includes sense amplifier units SAU0 to SAU(m−1) (hereinafter, represented by sense amplifier units SAU) corresponding to the bit lines BL0 to BL(m−1). Each sense amplifier unit SAU includes a sense amplifier SA, and data latch circuits SDL, ADL, BDL, and CDL. The sense amplifier SA, and the data latch circuits SDL, ADL, BDL, and CDL are connected to each other such that data may be transferred.

The data latch circuits SDL, ADL, BDL, and CDL temporarily store data. During a write operation, the sense amplifier SA controls a voltage of the bit line BL according to data stored by the data latch circuit SDL. The data latch circuits ADL, BDL, and CDL are used for a multi-value operation in which the memory cell transistor MT stores data of 2 or more bits. For example, assuming that pages corresponding to bits of 3-bit data, respectively, are a lower page, a middle page, and an upper page, the data latch circuit ADL is used for storing a lower page. The data latch circuit BDL is used for storing a middle page. The data latch circuit CDL is used for storing an upper page. The number of data latch circuits provided in the sense amplifier unit SAU may be freely changed according to the number of bits stored in one memory cell transistor MT.

During a read operation, the sense amplifier SA detects data read on the corresponding bit line BL, and determines whether the data is "0" data, or "1" data. During a write operation, the sense amplifier SA applies a voltage to the bit line BL based on write data.

The data register 24B includes data latch circuits XDL corresponding to the number of the sense amplifier units SAU0 to SAU(m−1). The data latch circuit XDL is connected to the input/output circuit 22. The data latch circuit XDL is a circuit used for data transfer between the sense amplifier 24 and the outside, and then temporarily stores write data sent from the input/output circuit 22 and temporarily stores read data sent from the sense amplifier unit SAU. More specifically, data transfer between the input/output circuit 22 and the sense amplifier units SAU0 to SAU(m−1) is performed through the data latch circuits XDL for one page. Write data received by the input/output circuit 22 is transferred to any one of the data latch circuits ADL, BDL, and CDL via the data latch circuit XDL. Read data read by the sense amplifier SA is transferred to the input/output circuit 22 via the data latch circuit XDL.

(Row Decoder)

Figure 7:
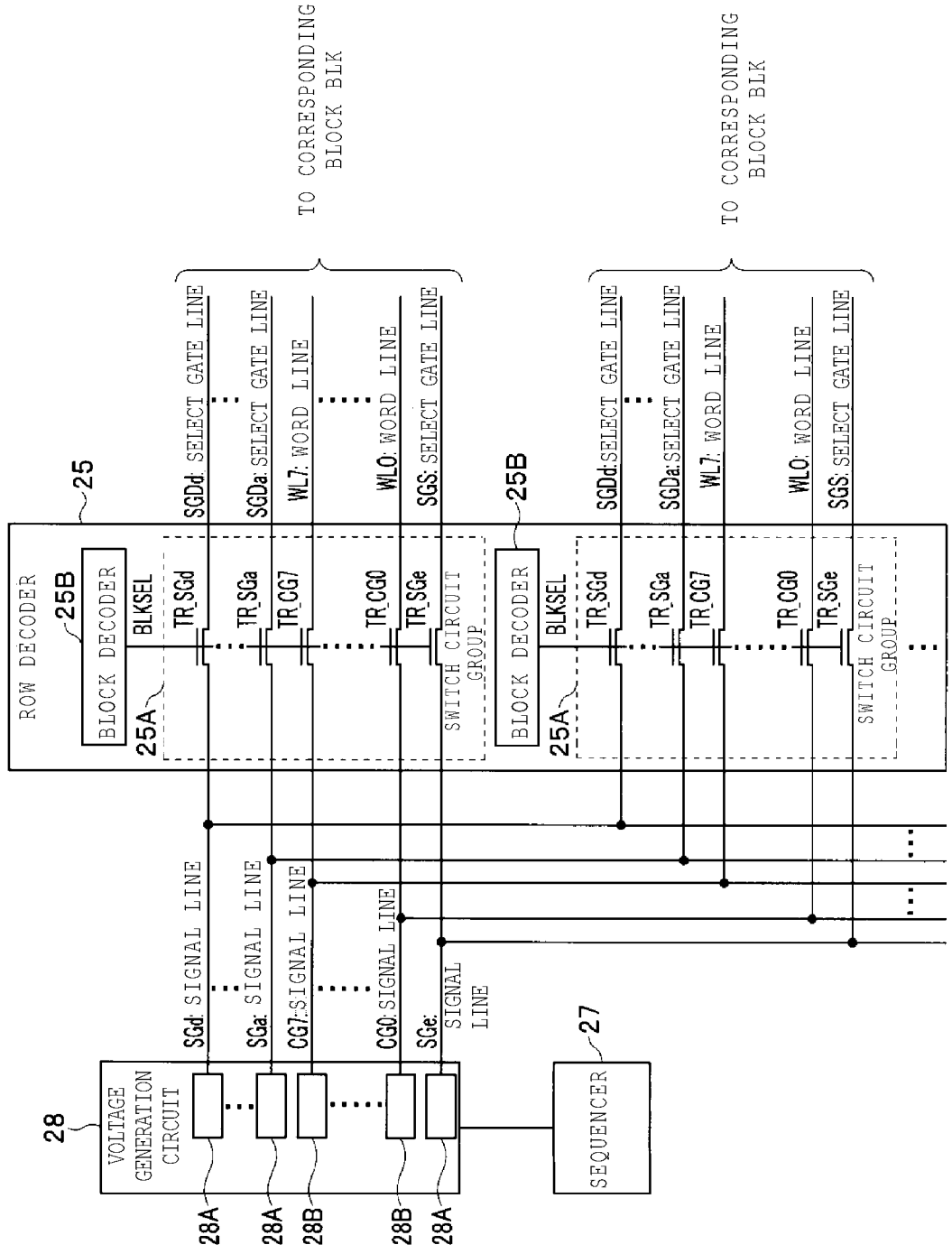
FIG. 7 is a block diagram of a row decoder.

FIG. 7 is a block diagram illustrating an example of a configuration of the row decoder 25 in FIG. 2.

The voltage generation circuit 28 includes a plurality of SG drivers (that is, select gate line drivers) 28A that supply voltages to signal lines SGa to SGe, respectively, and a plurality of CG drivers (that is, word line drivers) 28B that supply voltages to signal lines CG0 to CG7, respectively. These signal lines SGa to SGe, and CG0 to CG7 are branched by the row decoder 25, and are connected to wirings of each block BLK. That is, the signal lines SGa to SGd function as global drain-side select gate lines, and are connected to select gate lines SGDa to SGDd (represented by select gate lines SGD) as local select gate lines in each block BLK, via the row decoder 25. As described above, the select gate transistor ST1 may include a plurality of select gate transistors. The example of FIG. 7 illustrates an example in which the select gate transistor ST1 includes four select gate transistors, and gate voltages are applied to gates of these four select gate transistors by the select gate lines SGDa to SGDd.

The signal lines CG0 to CG7 function as global word lines, and are connected to the word lines WL0 to WL7 as local word lines in each block BLK, via the row decoder 25. The signal line SGe functions as a global source-side select gate line, and is connected to the select gate line SGS as a local select gate line in each block BLK, via the row decoder 25.

The voltage generation circuit 28 is controlled by the sequencer 27 to generate various voltages. The SG drivers 28A and the CG drivers 28B supply the generated various voltages to the corresponding signal lines SGa to SGe and the corresponding signal lines CG0 to CG7, respectively. The SG drivers 28A generate gate voltages, respectively, to be supplied to the select gate lines SGD and SGS. The gate voltages generated by the SG drivers 28A are supplied to gates of the select gate transistors ST1 and ST2. Each CG driver 28B selects and supplies a voltage such as a voltage VCGRV, a voltage VREAD, or a voltage VCG_ER, to the corresponding word line WL according to an operation target (that is, a row address) in a read operation.

The row decoder 25 includes a plurality of switch circuit groups 25A corresponding to blocks, respectively, and a plurality of block decoders 25B that is provided corresponding to the plurality of switch circuit groups 25A, respectively. Each switch circuit group 25A includes a plurality of transistors TR_SGa to TR_SGd which connect the signal lines SGa to SGd to the select gate lines SGDa to SGDd, respectively, transistors TR_CG0 to TR_CG7 which connect the signal lines CG0 to CG7 to the word lines WL0 to WL7, respectively, and a transistor TR_SGe which connects the signal line SGe to the select gate line SGS. Each of the transistors TR_SGa to TR_SGe and the transistors TR_CG0 to TR_CG7 is a high withstand voltage transistor.

Each block decoder 25B supplies a block select signal BLKSEL to gates of the transistors TR_SGa to TR_SGe and the transistors TR_CG0 to TR_CG7 when the block decoder 25B itself is designated by a row address. Therefore, in the switch circuit group 25A to which the block select signal BLKSEL is supplied from the block decoder 25B designated by the row address, the transistors TR_SGa to TR_SGe and the transistors TR_CG0 to TR_CG7 are turned ON and are in a conductive state. Thus, voltages supplied from the voltage generation circuit 28 to the signal lines SGa to SGe and the signal lines CG0 to CG7 are supplied to the select gate lines SGDa to SGDd, and SGS and the word lines WL0 to WL7 provided in the block BLK as an operation target.

(Threshold Voltage Distribution)

When multi-value data is written into a memory cell transistor MT, a threshold voltage of the memory cell transistor MT is set as a value corresponding to a value of the data. When a program voltage VPGM and a bit line voltage VBL are applied to the memory cell transistor MT, electrons are injected into the charge storage film 336 and the threshold voltage rises. By increasing the program voltage VPGM, the injection amount of electrons may be increased, and the threshold voltage of the memory cell transistor MT may be increased. However, even if the same program voltage VPGM is applied, due to a variation between the memory cell transistors MT, the injection amount of electrons differs depending on each memory cell transistor MT. Once injected, the electrons are stored until an erase operation is performed. Therefore, a program operation and a verify operation (that is, loop) are performed multiple times while gradually increasing the program voltage VPGM so as not to exceed a threshold voltage range (hereinafter, referred to as a target region) allowable as the threshold voltage to be set for each memory cell transistor MT.

Then, after a program operation, by reading data, a verify operation of determining whether the threshold voltage of the memory cell transistor has reached the target region is performed. As the above combination of the program operation and the verify operation is repeatedly performed, the threshold voltage of the memory cell transistor rises to the target region. The memory cell transistor whose threshold voltage has reached the target region in the verify operation, that is, the memory cell transistor determined to exceed a target level which is the lowest value of the target region, is subsequently prohibited for writing.

Figure 8:
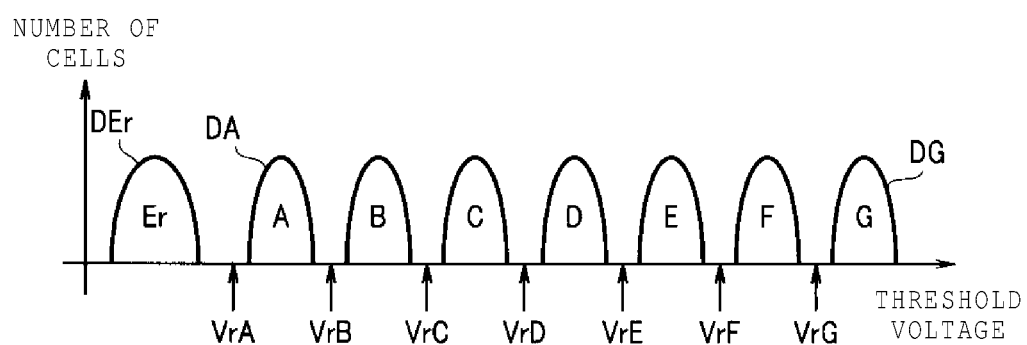
FIG. 8 is a view illustrating a threshold voltage distribution of a memory cell array.

FIG. 8 is a view illustrating a threshold voltage distribution of the memory cell array, in which a threshold voltage is set for the horizontal axis, and the number of memory cell transistors (that is, the number of cells) is set for the vertical axis. FIG. 8 illustrates an example of a threshold voltage distribution in the non-volatile memory 2 of 3 bits/Cell. In the non-volatile memory 2, the threshold voltage of the memory cell transistor MT is set according to each data value of multi-value data stored in the memory cell transistor MT. Since the injection of the amount of electric charges into the charge storage film (that is, the charge storage region) 336 is probabilistic, as illustrated in FIG. 8, respective threshold voltages of the memory cell transistors MT are also statistically distributed.

FIG. 8 illustrates the threshold voltage distribution in eight lobe-shaped regions of DEr, DA, DB, DC, . . . DG, and in each of these regions, the width of the threshold voltage corresponds to each target region. In the example of FIG. 8, by setting any one of the eight target regions, as the threshold voltage of the memory cell transistor MT, it is possible to store 8-value data (3-bit data) in the memory cell transistor MT.

In the first embodiment, a target region where the threshold voltage Vth is equal to or lower than the voltage VrA in FIG. 8 is called an erase state (Er state), a target region where the threshold voltage is higher than the voltage VrA and is equal to or lower than the voltage VrB is called an A state, a target region where the threshold voltage is higher than the voltage VrB and is equal to or lower than the voltage VrC is called a B state, and a target region where the threshold voltage is higher than the voltage VrC and is equal to or lower than the voltage VrD is called a C state. Hereinafter, similarly, as illustrated in FIG. 8, a D state to a G state are set according to voltages, respectively.

That is, the state indicates which target region corresponds to a data value stored in each memory cell transistor MT. In the case of 3 bits (8 values), a target region may be divided into eight states of an Er state, and A to G states. Threshold voltage distributions corresponding to the Er, A, B, . . . F, and G states, respectively, are called distributions DEr, DA, DB, . . . DF, and DG, respectively. Each of the voltages VrA to VrG is a reference voltage that becomes a boundary of each target region. In the verify operation, the voltages VrA to VrG may be applied to the word lines WL, as verify levels (that is, voltages) so as to perform reading, and then it may be determined that the threshold voltage corresponding to the level is reached when the target memory cell transistor MT is turned OFF.

(Read Operation)

In reading data from a multi-valued memory cell transistor, the row decoder 25 applies a read voltage to a word line WL to which a memory cell transistor MT as a read target is connected (hereinafter, referred to as a selected word line), and the sense amplifier 24 senses data read on a bit line BL, and determines whether the read data is "0" or "1". In order to put a memory cell transistor connected to a word line WL other than the selected word line (hereinafter, referred to as a non-selected word line), in a conducive state, the row decoder 25 gives the non-selected word line WL a sufficiently high voltage VREAD required to turn ON each memory cell transistor.

During a read operation, the sense amplifier 24 fixes the bit line BL to a constant voltage (for example, 0.5 V), and charges a sense node inside the sense amplifier SA to a predetermined precharge voltage Vpre higher than the voltage of the bit line BL. In this state, the sense amplifier 24 electrically connects the sense node to the bit line BL. Then, a current flows from the sense node to the bit line BL, and the voltage of the sense node gradually drops.

The voltage of the sense node changes according to the state of the threshold voltage of the memory cell transistor connected to the corresponding bit line BL. That is, when the threshold voltage of the memory cell transistor is lower than a read voltage, the memory cell transistor is in the ON state. Then a large cell current flows through the memory cell transistor, and the speed at which the voltage of the sense node drops increases. When the threshold voltage of the memory cell transistor is higher than a read voltage, the memory cell transistor is in the OFF state. Then, a cell current flowing through the memory cell transistor is small or no cell current flows through the memory cell transistor, and the speed at which the voltage of the sense node drops decreases.

By using such a difference in the voltage drop rate of the sense node, the write state of the memory cell transistor is determined, and the result is stored in the data latch circuit. For example, at the first time point when a predetermined first period elapses from the start time of discharging (that is, the beginning of discharging of electric charges of the sense node), it is determined whether the voltage of the sense node is a low level ("L") or a high level ("H"). For example, when the threshold voltage of the memory cell transistor is lower than the read voltage, the memory cell transistor is in the completely ON state, and a large cell current flows through the memory cell transistor. Thus, the voltage of the sense node rapidly drops, and the voltage drop amount is relatively large, and then the sense node becomes "L" at the first time point.

When the threshold voltage of the memory cell transistor is higher than the read voltage, the memory cell transistor is in the OFF state, and the cell current flowing through the memory cell transistor is very small or no cell current flows through the memory cell transistor. Thus, the voltage of the sense node highly gently drops, and the voltage drop amount is relatively small, and then the sense node is maintained at "H" at the first time point.

In this manner, it is determined whether the threshold voltage of the memory cell transistor is higher or lower than the read voltage, when the row decoder 25 applies the read voltage to the selected word line, and the sense amplifier 24 monitors the state of the sense node. Therefore, by applying a voltage between the levels, as the read voltage, to the selected word line WL, the level of each memory cell transistor may be determined, and data allocated to each level may be read.

(Task of Erasure)

Figure 9:
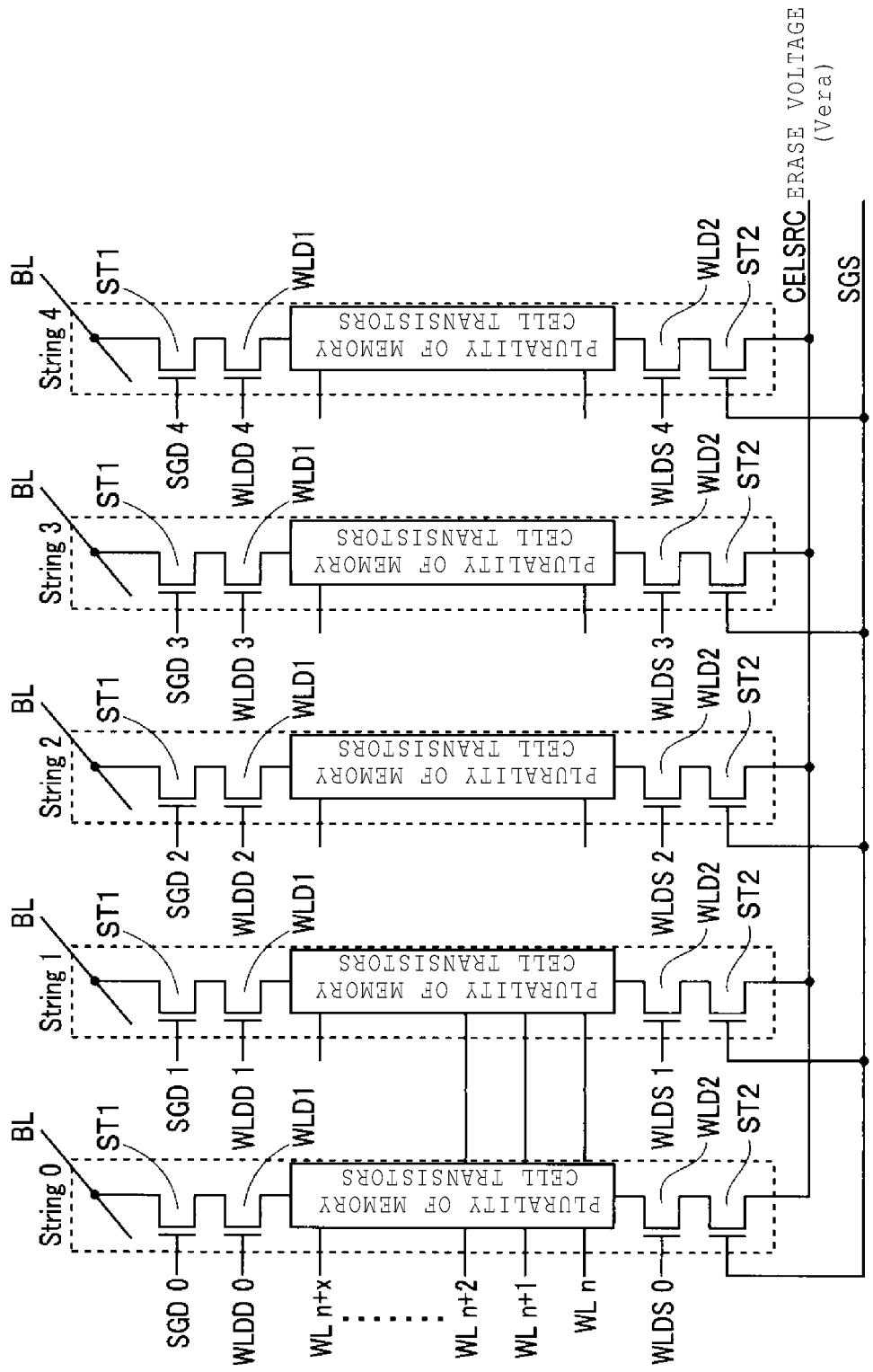
FIG. 9 is a circuit diagram of strings of a memory cell array.

FIG. 9 is a circuit diagram illustrating a circuit configuration of each string of FIG. 5 constituting the memory cell array 23. As illustrated in FIG. 9, in each of String0 to String4, a select gate transistor ST1, a plurality of memory cell transistors MT and a select gate transistor ST2 are connected in series between a bit line BL and a source line CELSRC. FIG. 9 illustrates an example where a dummy memory cell transistor WLD1 is provided between the select gate transistor ST1 and the plurality of memory cell transistors MT, and a dummy memory cell transistor WLD2 is provided between the select gate transistor ST2 and the plurality of memory cell transistors MT.

All drains of the select gate transistors ST1 of the String0 to String4 are connected to the bit lines BL, and a predetermined bit line voltage is applied. All sources of the select gate transistors ST2 of the String0 to String4 are connected to the source line SELSRC.

During erasure, a high erase voltage Vera is applied to the source line SELSRC and the bit line BL, and the inside of the memory hole is filled with holes generated by gate-induced drain leakage (GIDL) due to a potential difference between SGD/SGS. Then, electric charges accumulated on the charge storage film of the memory cell transistor MT and the holes are recombined to eliminate electrons so that the threshold voltage is returned to the Er state (erase state).

In the development of three-dimensional non-volatile memory devices, capacity increases are always in progress and it is thus often required to reduce the diameter of memory holes used for forming the memory cells and also the distance between adjacent memory holes. Due to such miniaturization, variations are likely to occur in a word line forming step. Thus, for erasing and programming operations, a variation in the operation characteristic between the strings becomes larger and nonignorable. In particular, when variation between erase states is large between different strings, the program operation characteristic of the memory cells is adversely affected, and variations in the write time or variations in the erase and program stress amplitude occur. This makes it difficult to maintain uniform reliability characteristics of individual memory cells.

(Improvement of Erasure characteristic for Each String)

Therefore, the erasure characteristic in each string, that is, the erasure characteristic of each string unit SU, is detected, and according to the detected erasure characteristic, a timing of when a control voltage is applied to the select gate line SGD to put the select gate transistor ST1 in a conductive state is controlled for each string (that is, each string unit) so that a uniform erase state may be obtained in the strings. In the present embodiment, the erasure characteristic is determined by high/low erase states obtained in a normal erase operation (hereinafter, referred to as the depth of the erase state). It is assumed that the lower the erase state (that is, the larger the difference from the A state), the deeper the erase state, and the higher the erase state (that is, the smaller the difference from the A state), the shallower the erase state.

Figure 10:
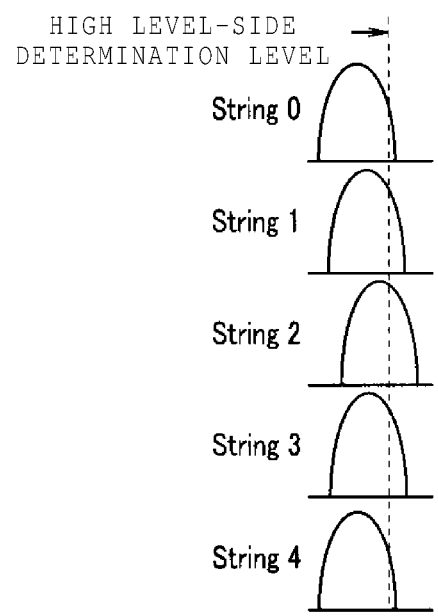
FIG. 10 is an explanatory view illustrating aspects related to an erase state depth and a determination method thereof.
Figure 11:
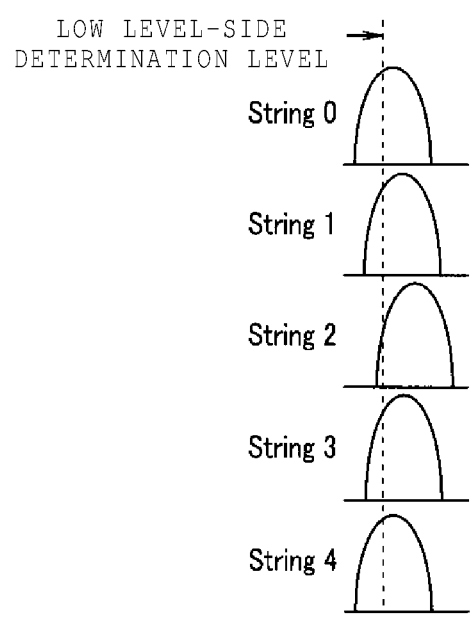
FIG. 11 is an explanatory view illustrating aspects related to an erase state depth and a determination method thereof.

FIG. 10 and FIG. 11 are explanatory views illustrating an erase state depth and a determination method thereof. FIG. 10 and FIG. 11 illustrate the threshold voltage distribution of the erase state of the memory cell array in each string, through the same notation method as that of FIG. 8. FIG. 10 and FIG. 11 illustrate erase states obtained at successful erasing in a normal erase operation, and have threshold voltage distributions at voltages lower than the voltage VrA of FIG. 8, in all String0 to String4.

As illustrated in FIG. 10 and FIG. 11, erase state depths of the strings are different from each other, and in the example of FIG. 10 and FIG. 11, the erase states of the String0 and String4 are the deepest, the erase state of the String2 is the shallowest, and the erase states of the String1 and String3 have depths between the aforementioned erase states.

After a normal erase operation, the sequencer 27 detects the erase state depth of each string. For example, in the example of FIG. 10, the sequencer 27 sets a predetermined determination level (hereinafter, referred to as a high level-side determination level) on a side of a higher level than a threshold voltage distribution peak at which the number of cells is the peak, and detects the number of cells (that is, the number of bits) on a level higher than the corresponding high level-side determination level. It may be determined that the smaller the number of cells, the deeper the erase state depth, and the larger the number of cells, the shallower the erase state depth. In the example of FIG. 11, the sequencer 27 sets a predetermined determination level (hereinafter, referred to as a low level-side determination level) on a side of a lower level than a threshold voltage distribution peak at which the number of cells is the peak, and detects the number of cells (that is, the number of bits) on a level lower than the corresponding low level-side determination level. It may be determined that the larger the number of cells, the deeper the erase state depth, and the smaller the number of cells, the shallower the erase state depth.

The sequencer 27 records the determination results of the erase state depths, as erase state depth information, in the management area of the memory cell array 23. The sequencer 27 may record the number of cells of each string obtained through the above determination, as the erase state depth information, in the management area of the memory cell array 23, or may record the order of erase state depths of the strings, as the erase state depth information, in the management area of the memory cell array 23.

In order to obtain erase state depth information, first, the sequencer 27 sets a high level-side determination level or a low level-side determination level (hereinafter, these will be referred to as determination levels when there is no need to distinguish them). The sequencer 27 sequentially applies determination level voltages to the word lines WL, respectively, in order to detect the number of cells on a level higher or lower than the determination level, and the sense amplifier 24 performs a read operation of determining a conductive state of each memory cell. In this case, in order to shorten the detection time required for detecting the erase state depth, the determination may be performed on a predetermined number of memory cells instead of all memory cells in each string. Further, assuming that the relationship between the respective characteristics of the strings also similarly occurs in any memory cell transistor, representative memory cells may be selected from each string, and reading may be performed by applying several types of determination levels of voltages to target word lines WL, so that the range of threshold voltages of the selected memory cells may be detected, and the erase state depth may be determined in each string based on the detected range of the threshold voltages.

In the present embodiment, during erasure, the generation of a gate voltage by the SG driver 28A in the voltage generation circuit 28 is controlled based on the erase state depth information. That is, the SG driver 28A raises the gate voltage to be supplied to the select gate transistor ST1 of a string whose erase state is determined to be shallower by the erase state depth information, at an earlier time, and raises the gate voltage to be supplied to the select gate transistor ST1 of a string whose erase state is determined to be deeper, at a later time. For example, when the order of erase state depth from the shallow side to the deep side is the String2, String1, String3, String0, and String4, during erasure, the SG driver 28A is controlled so as to raise gate voltages to be supplied to the select gate transistor ST1 of the String2, the select gate transistor ST1 of the String1, the select gate transistor ST1 of the String3, the select gate transistor ST1 of the String0, and the select gate transistor ST1 of the String4, in this order.

(Action)

Figure 12:
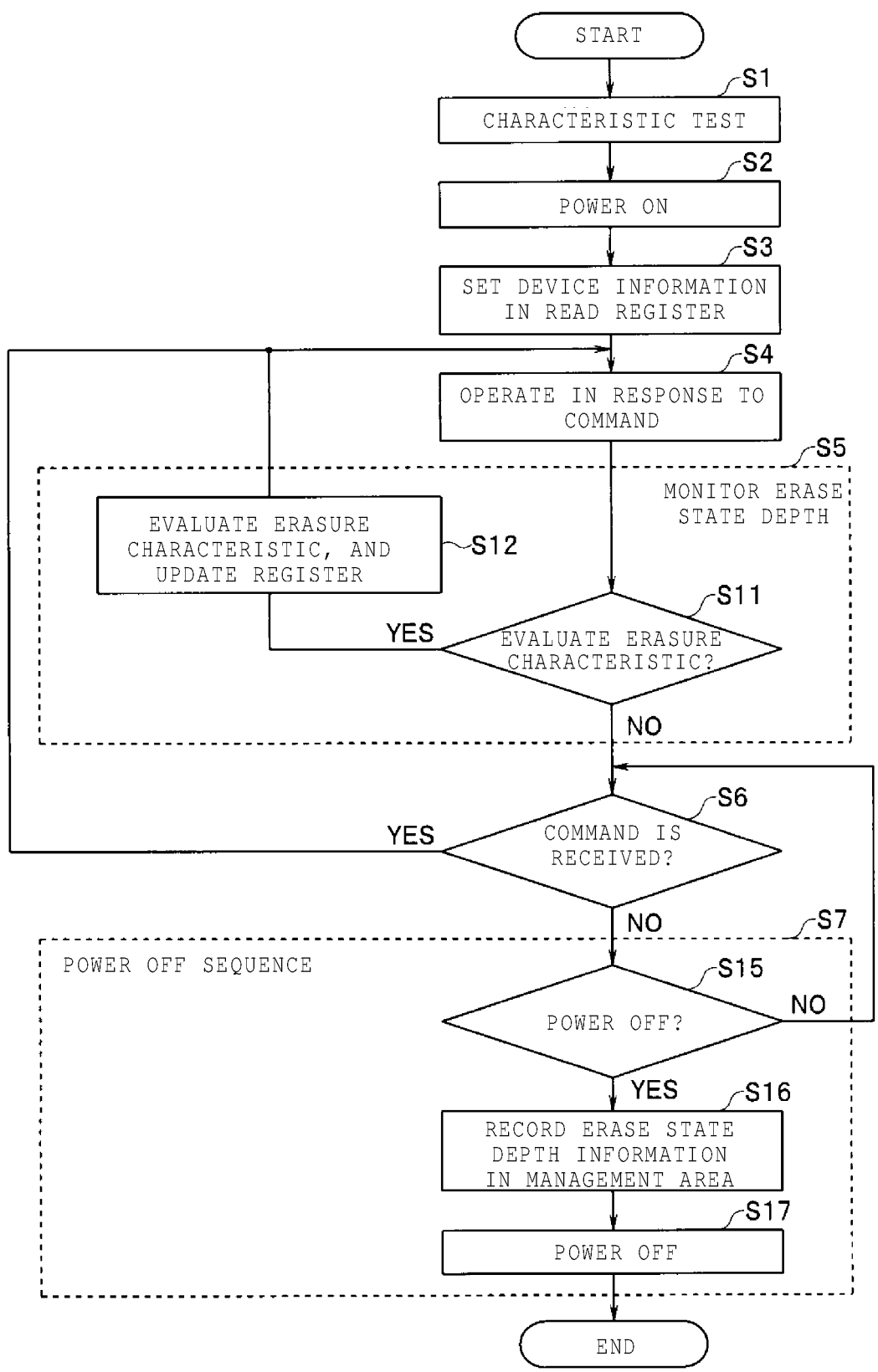
FIG. 12 is a flow chart illustrating an erase operation in a first embodiment.
Figure 13:
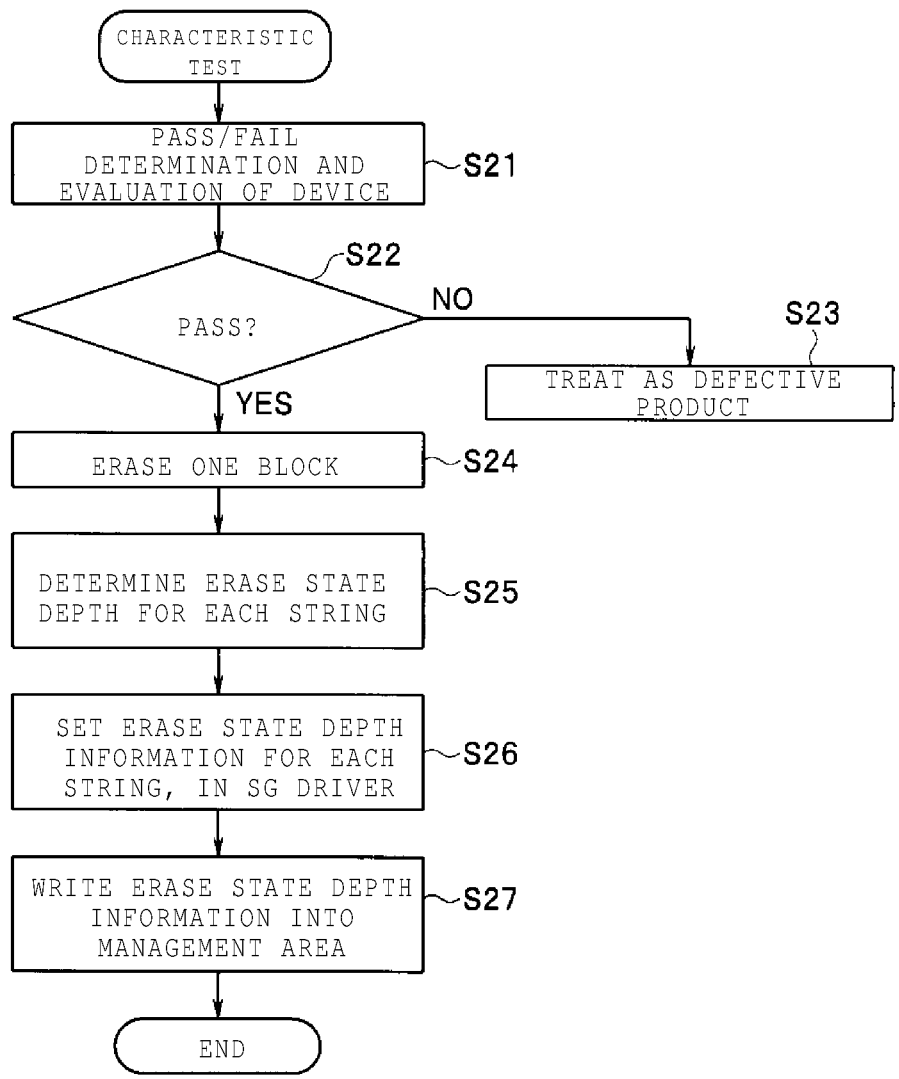
FIG. 13 is a flow chart of a procedure of a characteristic test.
Figure 14:
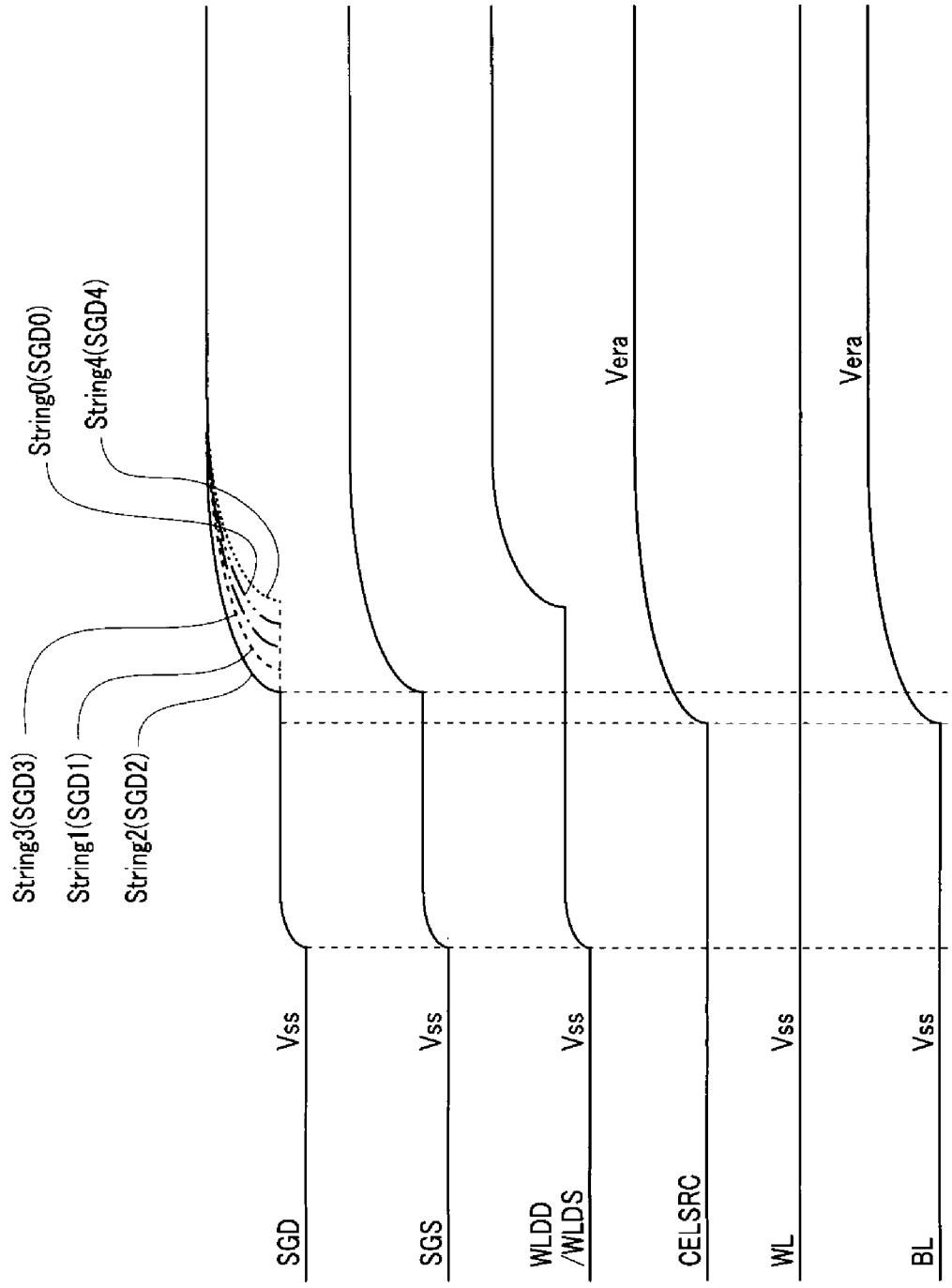
FIG. 14 is a waveform diagram illustrating voltage waveforms during erasure in a first embodiment.

Next, the operation of the embodiment configured in this manner will be described with reference to FIGS. 12 to 14. FIG. 12 is a flow chart illustrating an erase operation of the first embodiment, and FIG. 13 is a flow chart illustrating an example of the procedure of a characteristic test in FIG. 12. FIG. 14 is a waveform diagram illustrating the voltage waveforms during erasure in the first embodiment.

Step S1 in FIG. 12 illustrates a characteristic test performed prior to product shipping. In this characteristic test, the erase state depth is obtained in each string, and is recorded as erase state depth information, in the management area of the memory cell array 23.

FIG. 13 illustrates an example of a specific procedure of erase state depth detection performed in the characteristic test. In step S21 of FIG. 13, pass/fail determination evaluation of a device is performed. When the evaluation is not pass (NO determination in S22), the device is treated as a defective product (S23). When the evaluation is pass (YES determination in S22), the erasure characteristic is determined and erasure setting for each string is performed in steps S24 to S26. That is, through a normal erase operation, a block is erased (S24). Next, the erase state depth is determined for each string by the above-described method (S25). For example, the number of cells (that is, the number of bits) exceeding the determination level is counted, and the erase state depth is determined by the count value. Next, erase state depth information for each string is set in the SG driver 28A in the voltage generation circuit 28.

For example, in step S25, when the order of the determined erase state depth from the shallow side to the deep side is the String2, String1, String3, String0, and String4, the SG driver 28A is set such that gate voltages to be supplied to the select gate transistor ST1 of the String2, the select gate transistor ST1 of the String1, the select gate transistor ST1 of the String3, the select gate transistor ST1 of the String0, and the select gate transistor ST1 of the String4 are raised in this order.

The erase state depth information is recorded as device information, in the management area of the memory cell array 23 (S27).

A variation in the erasure characteristic between the strings regarding the erase state depth can be caused by the manufacturing process and may also possibly depend on the three-dimensional structure of the memory cell array. For example, it may be that a string closer to the insulating layer ST tends to have a deeper erase state, and a string farther from the insulating layer ST tends to have a shallower erase state. Therefore, it is not necessarily required to determine the erase state depth through the characteristic test. Then, steps S24 to S26 in FIG. 13 may be omitted, and the erase state depth information based on the physical arrangement of the strings may be recorded in the management area of the memory cell array 23.

In actual use, when the power is turned ON (POWER ON) (S2), the sequencer 27 reads device information from the management area of the memory cell array 23, and sets the erase state depth information provided in the device information in the register (S3). The sequencer 27 performs an erase operation, a write operation, and a read operation according to the input command (S4).

When an instruction for an erase operation is made, the sequencer 27 controls the erase operation based on the erase state depth information. An erase operation on this basis is referred to as a string-based erase operation. In the string-based erase operation, the sequencer 27 instructs the SG driver 28A of the voltage generation circuit 28 to raise the gate voltage so that the gate voltage is applied to the select gate line SGD, at a timing based on the erase state depth information.

FIG. 14 illustrates the voltage waveforms of each part in the string-based erase operation. As illustrated in FIG. 14, in the string-based erase operation, first, the sequencer 27 controls the voltage generation circuit 28 to apply an erase voltage Vera to the source line CELSRC and the bit line BL. Next, the sequencer 27 causes the SG driver 28A to apply a gate voltage for turning ON the select gate transistors ST2, to the select gate line SGS, and to sequentially apply gate voltages for turning ON the select gate transistors ST1, to the select gate lines SGD of the strings. FIG. 14 illustrates an example where the order of the erase state depth from the shallow side to the deep side is the String2, String1, String3, String0, and String4. In this case, as illustrated in FIG. 14, first, the SG driver 28A applies a gate voltage for turning ON the select gate transistor ST1 of the String2 to the select gate line SGD2 (see FIG. 9). Next, the SG driver 28A applies a gate voltage for turning ON the select gate transistor ST1 of the String1 to the select gate line SGD1. Then, similarly, the SG driver 28A sequentially supplies a gate voltage for turning ON the select gate transistor ST1 of the String3, a gate voltage for turning ON the select gate transistor ST1 of the String0, and a gate voltage for turning ON the select gate transistor ST1 of the String4, in this order, to the select gate lines SGD3, SGD0, and SGD4.

As a result, in the String2 to which the gate voltage for turning ON the select gate transistor ST1 is supplied earliest, the erase voltage Vera is applied to the plurality of memory cell transistors MT earliest. Thus, the erase state of the memory cell transistors MT of the String2 is likely to be deepened. Likewise, the select gate transistors ST1 of the String1, String3, String0, and String4 are sequentially turned ON, and the erase voltages Vera are sequentially applied to the respective memory cell transistors MT in the strings. In this manner, the erase states of the String2, String1, String3, String0, and String4 are likely to be deepened in this order. As a result, regardless of characteristics of erase state depths in the strings, through the string-based erase operation, erase state depths are likely to be uniform in the strings.

This makes it possible to prevent variations in the subsequent write time of memory cells, and to uniformly maintain reliability characteristics of the memory cells.

In actual use, there is a possibility that the erasure characteristic may change with use or time. Therefore, the sequencer 27 may re-evaluate the erasure characteristic (that is, the erase state depth) at a predetermined timing, for example, whenever the string-based erase operation is performed a predetermined number of times (for example, several times) (S5 monitoring the erase state depth). The number of the string-based erase operations regarding re-evaluation of the erasure characteristic may be appropriately set.

In S5, the sequencer 27 determines whether it is time to evaluate the erasure characteristic (S11). When it is not yet time to evaluate the erasure characteristic (NO determination in S11), the sequencer 27 determines whether the command has been received (S6). When the command is received (YES determination in S6), the sequencer 27 returns the process to step S4, and performs an operation according to the command. When a command is not yet received (NO determination in S6), the sequencer 27 determines whether an instruction to power OFF has been made (S15) in a power OFF sequence (S7). When there has been no instruction to power OFF (NO determination in S15), the process is returned to step S6, and a standby state maintained.

When determining that it is time to evaluate the erasure characteristic (YES determination in S11), the sequencer 27 evaluates the erasure characteristic and updates the register in step S12. That is, in this case, the sequencer 27 performs the same process as that in steps S24 to S26 of FIG. 13. That is, by performing a normal erase operation, the sequencer 27 determines the erase state depth for each string, and updates the register by the erase state depth information based on the determination result.

This makes it possible to make erase states uniform even when the erasure characteristic changes.

With the initial erase state depth information obtained in the characteristic test saved, new erase state depth information obtained through re-evaluation of erase state depths may be subsequently recorded.

When an instruction to power OFF is made (YES determination in S15), the sequencer 27 records the erase state depth information recorded in the register into the management area of the memory cell array 23 (S16), and then turns OFF the power (S17).

As described above, in the first embodiment, the erase state depth is determined and is recorded as an erasure characteristic for each string, and the application period of the erase voltage for each string is adjusted based on the recorded information. This makes it possible to make erase state depths uniform and to improve the erasure characteristic, thereby improving reliability characteristics of memory cells.

The above description concerns the order of rise timings of gate voltages to be supplied to the respective select gate lines SGD of the strings. Alternatively, the rise timings of the gate voltages may be set as timings corresponding to respective erase state depths of the strings.

Second Embodiment

Figure 15:
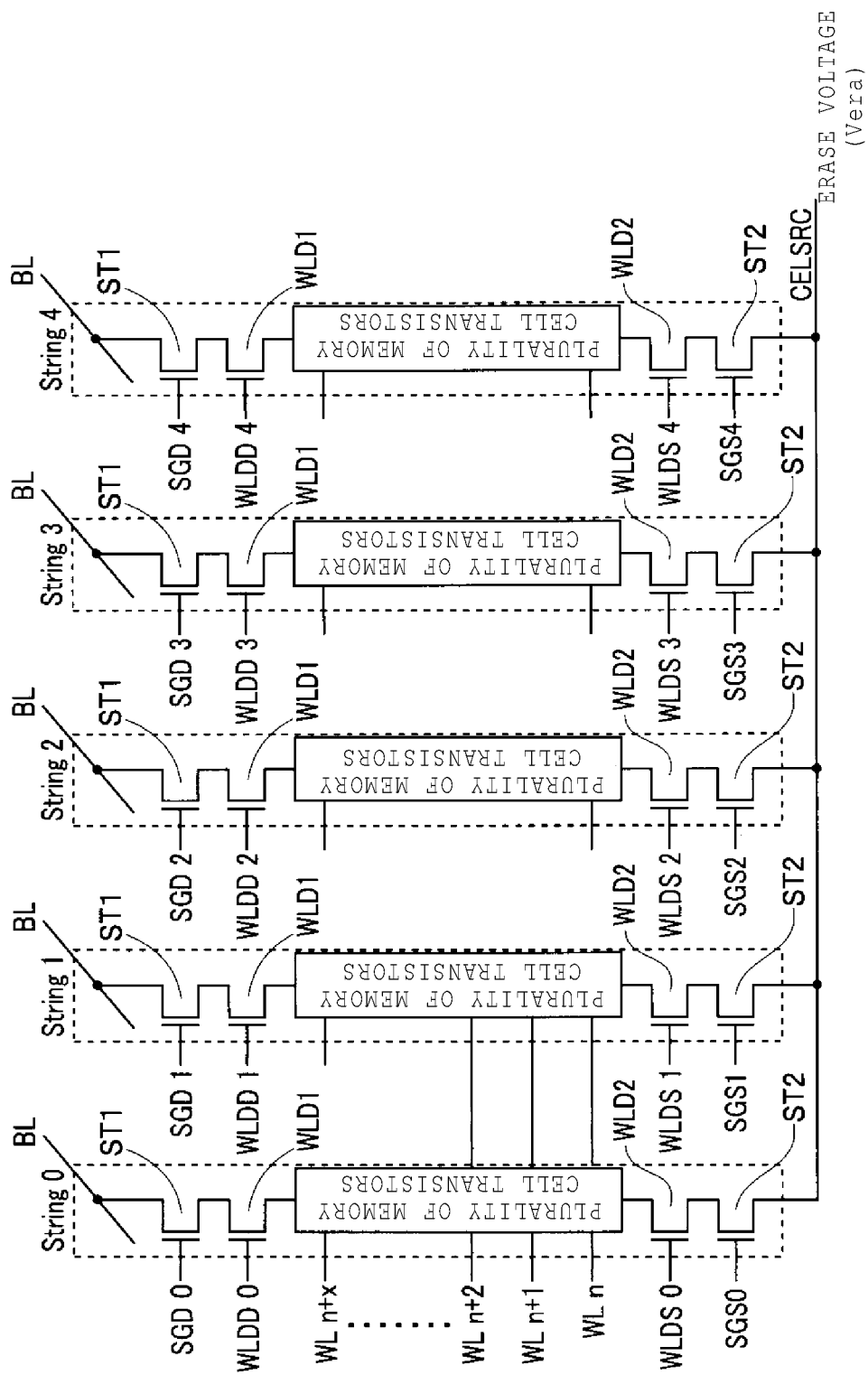
FIG. 15 is a circuit diagram illustrating aspects of a second embodiment.

FIG. 15 is a circuit diagram illustrating a second embodiment. FIG. 15 illustrates a circuit configuration of each string of the memory cell array 23. In FIG. 15, the components substantially the same as those described in conjunction with FIG. 9 are denoted by the same reference numerals and additional descriptions thereof will be omitted. In the second embodiment, the configuration of the memory cell array 23 is different from that in the first embodiment, but other configurations are the same as those in the first embodiment unless otherwise stated.

As illustrated in FIG. 15, in the second embodiment, gate voltages SGS0 to SGS4 are supplied to gates of the select gate transistors ST2 of the String0 to String4, respectively. That is, the second embodiment is different from the first embodiment, in that the respective select gate transistors ST2 of the strings may be independently controlled.

Figure 16:
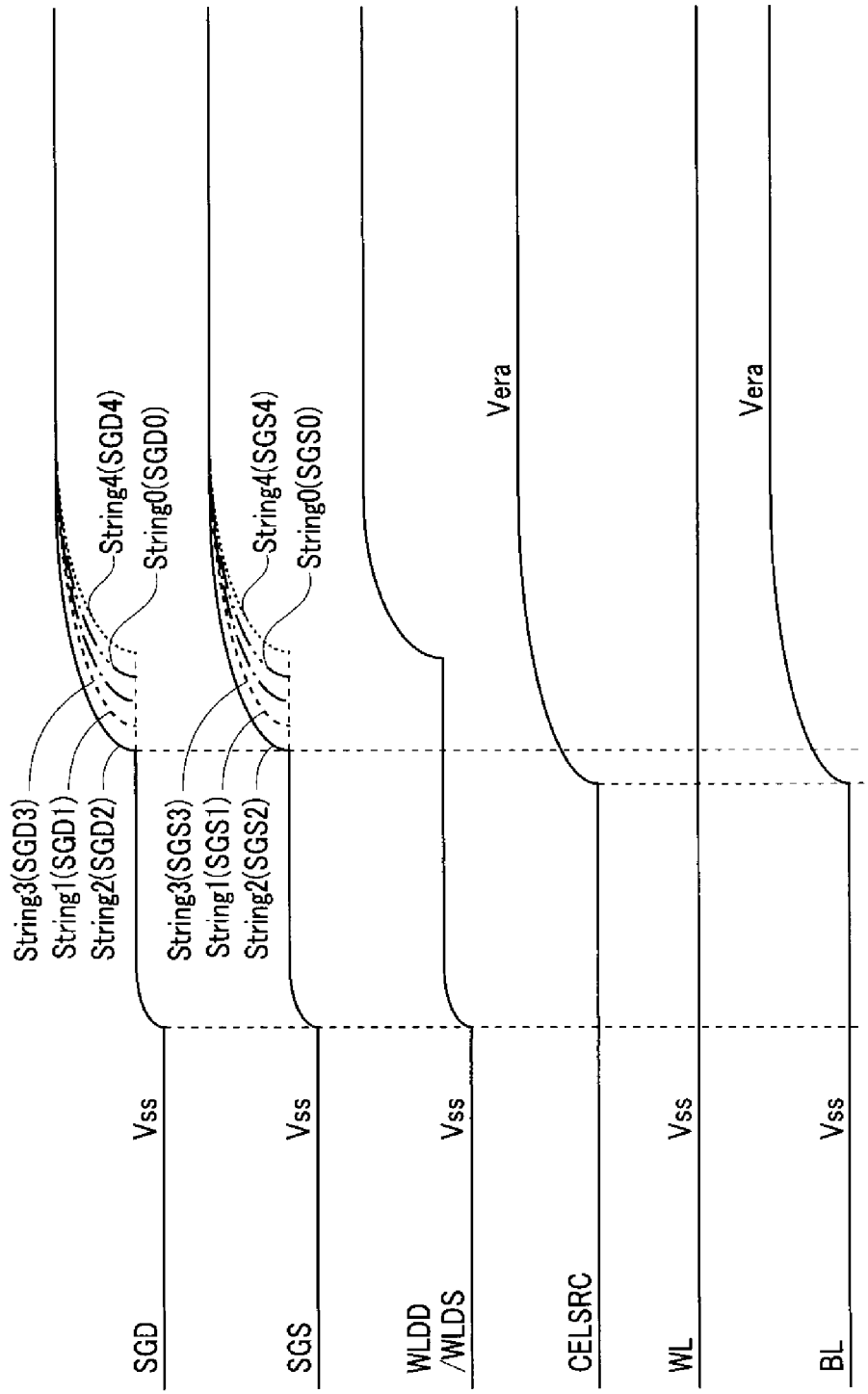
FIG. 16 is a waveform diagram illustrating voltage waveforms during erasure in a second embodiment.

Next, the operation of the second embodiment will be described with reference to FIG. 16. FIG. 16 is a waveform diagram illustrating voltage waveforms during erasure in the second embodiment.

The process flows of FIGS. 12 and 13 are also employed in the second embodiment. The second embodiment is different from the first embodiment in that in the string-based erase operation, not only the select gate transistor ST1 but also the select gate transistor ST2 is controlled for each string.

As illustrated in FIG. 16, in the string-based erase operation, first, the sequencer 27 controls the voltage generation circuit 28 to apply an erase voltage Vera to the source line CELSRC and the bit line BL. Next, the sequencer 27 sequentially applies gate voltages for turning ON the select gate transistors ST1 and ST2, to the select gate lines SGD and SGS of the strings. FIG. 16 illustrates an example where the order of the erase state depth from the shallow side to the deep side is the String2, String1, String3, String0, and String4. In this case, as illustrated in FIG. 16, first, the SG driver 28A applies a gate voltage for turning ON the select gate transistors ST1 and ST2 of the String2, to the select gate lines SGD2 and SGS2 (see FIG. 15). Next, the SG driver 28A applies a gate voltage for turning ON the select gate transistors ST1 and ST2 of the String1 to the select gate lines SGD1 and SGS1. Then, similarly, the SG driver 28A supplies a gate voltage for turning ON the select gate transistors ST1 and ST2 of the String3, a gate voltage for turning ON the select gate transistors ST1 and ST2 of the String0, and a gate voltage for turning ON the select gate transistors ST1 and ST2 of the String4, in this order, to the select gate lines SGD3 and SGS3, the select gate lines SGD0 and SGS0, and the select gate lines SGD4 and SGS4.

As a result, in the String2 to which the gate voltages for turning ON the select gate transistors ST1 and ST2 are supplied earliest, the erase voltage Vera is applied to the plurality of memory cell transistors MT earliest. Thus, the erase state of the memory cell transistors MT of the String2 is likely to be deepened. Then, likewise, the respective select gate transistors ST1 and ST2 of the String1, String3, String0, and String4 are sequentially turned ON, and the erase voltages Vera are sequentially applied to the respective memory cell transistors MT in the strings. In this manner, the erase states of the String2, String1, String3, String0, and String4 are likely to be deepened in this order. As a result, regardless of characteristics of erase state depths in the strings, through the string-based erase operation, erase state depths are likely to be uniform.

In the second embodiment, not only the select gate transistors ST1, but also the select gate transistors ST2 are controlled to be put in a conductive state in the same order as the select gate transistors ST1, and the control of the erase state depth is more reliably performed than in first embodiment.

In the second embodiment, the same effect as that in the first embodiment may be obtained. Furthermore, in the second embodiment the control over the erase state depth may be improved.

Third Embodiment

Figure 17:
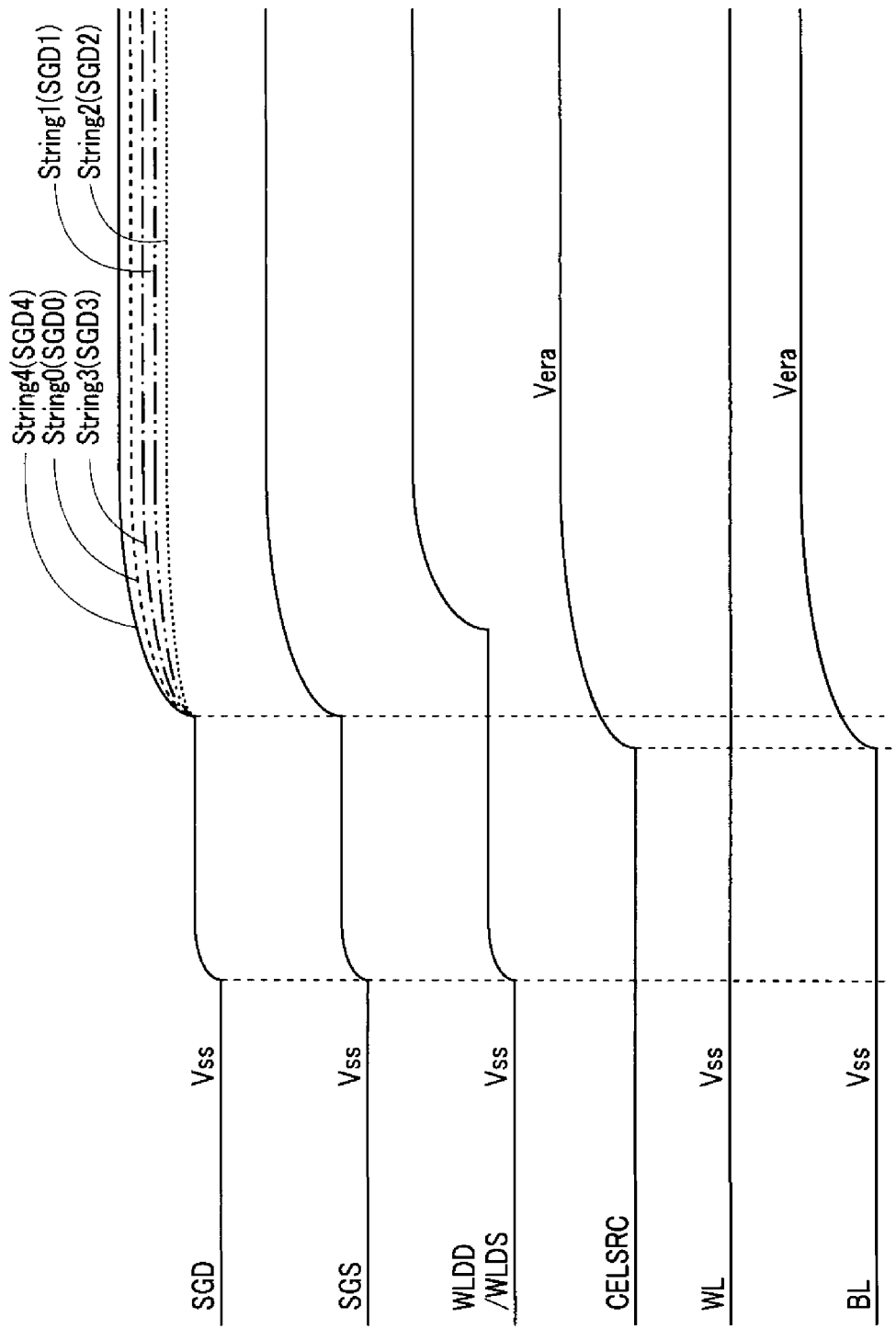
FIG. 17 is a waveform diagram illustrating aspects related to a third embodiment.

FIG. 17 is a waveform diagram illustrating aspects related to a third embodiment. The overall structural configuration of the third embodiment is the same as that of the first embodiment. However, in the third embodiment, the control in the string-based erase operation is different from that in the first embodiment.

In the first embodiment, the rise timings of gate voltages to be supplied to the respective select gate lines SGD of the strings are differentiated based on erase state depth information. In the third embodiment, voltage levels of gate voltages to be supplied to the respective select gate lines SGD of the strings are differentiated based on erase state depth information.

The process flows of FIGS. 12 and 13 are also employed in the third embodiment. The third embodiment is different from the first embodiment in that in the string-based erase operation, the gate voltage to be applied to the select gate transistor ST1 is changed according to each string.

As illustrated in FIG. 17, in the string-based erase operation, the sequencer 27 controls the voltage generation circuit 28 to apply an erase voltage Vera to the source line CELSRC and the bit line BL. Next, the sequencer 27 simultaneously applies gate voltages for turning ON the select gate transistors ST1 and ST2 to the select gate lines SGD and SGS of each string. The sequencer 27 controls the SG driver 28A of the voltage generation circuit 28 to supply a gate voltage based on erase state depth information to the select gate line SGD of each string.

Depending on a voltage difference between the gate voltage of the select gate line SGD and the voltage (that is, the erase voltage Vera) of the bit line BL, the conductive state of the select gate transistor ST1 is controlled and the amount of holes generated in the channel is changed. That is, the larger the voltage difference between the voltage of the select gate line SGD and the erase voltage Vera of the bit line BL, the larger the amount of the generated holes, and thus the erase state is likely to be deepened. Therefore, for the string having a shallower erase state, the gate voltage to be supplied to SGD of the corresponding string is reduced, and for the string having a deeper erase state, the gate voltage to be supplied to SGD of the corresponding string is raised.

FIG. 17 illustrates an example where the order of the erase state depth from the shallow side to the deep side is the String2, String1, String3, String0, and String4. In this case, as illustrated in FIG. 17, the SG driver 28A applies the lowest level of gate voltage to the select gate line SGD2 that supplies a gate voltage to the select gate transistor ST1 of the String2. The SG driver 28A applies a gate voltage higher than the gate voltage applied to the select gate line SGD2, as a gate voltage for turning ON the select gate transistor ST1 of the String1, to the select gate line SGD1. Likewise, assuming that gate voltages to be applied to the respective select gate lines SGD0 to SGD4 of the String0 to String4 are VSGD0 to VSGD4, respectively, the SG driver 28A supplies gate voltages having the relationship VSGD2<VSGD1<VSGD3<VSGD0<VSGD4 to the select gate lines SGD2, SGD1, SGD3, SGD0, and SGD4, respectively.

As a result, the amount of holes in the channel increases in the order of the String2, String1, String3, String0, and String4, and then the erase state is likely to be deepened in this order. Thus, regardless of characteristics of erase state depths in the strings, through the string-based erase operation, erase state depths are likely to be uniform in the strings.

With third embodiment, the same effect as that in the first embodiment may be obtained.

Fourth Embodiment

Figure 18:
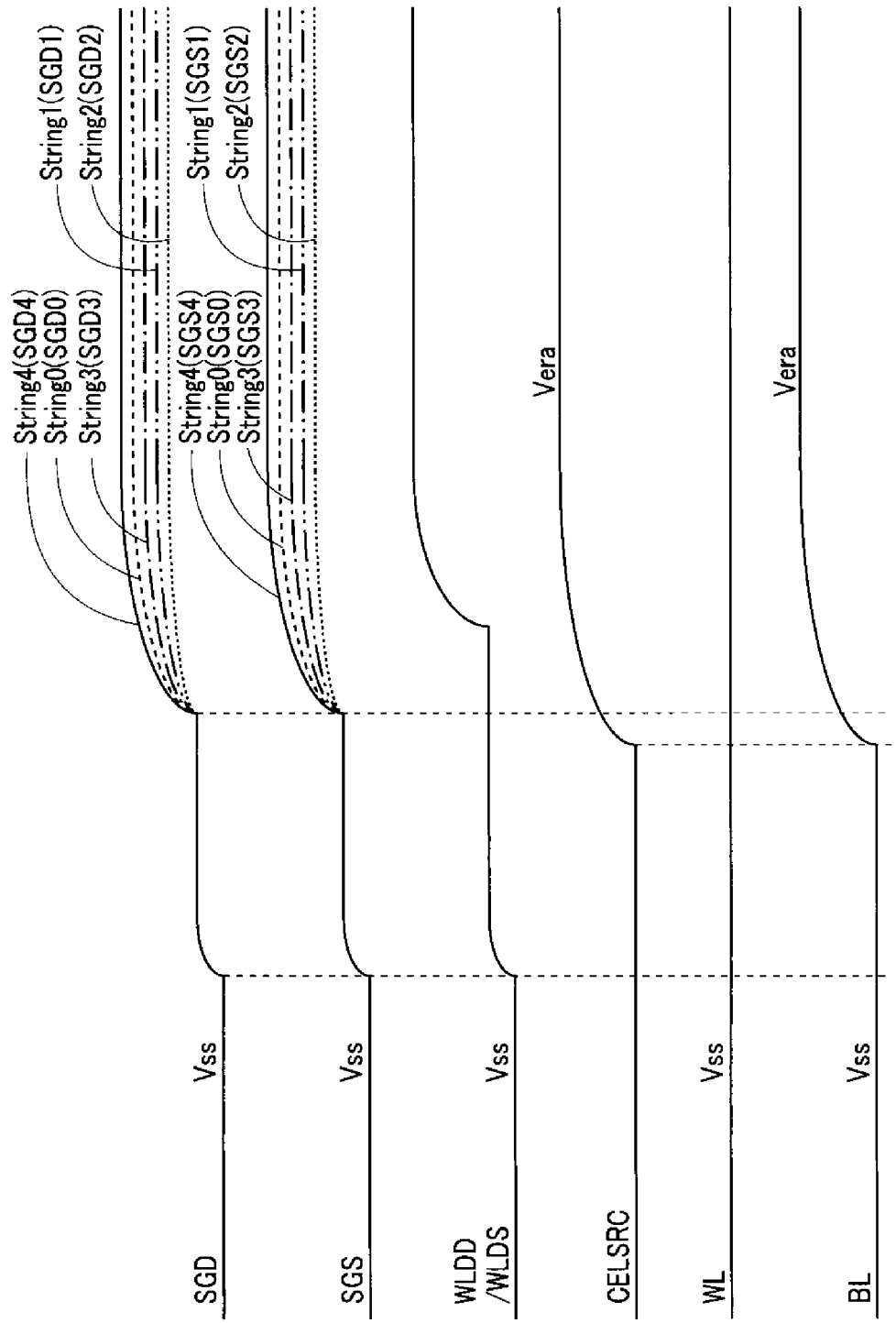
FIG. 18 is a waveform diagram illustrating aspects related to a fourth embodiment.

FIG. 18 is a waveform diagram illustrating aspects related to a fourth embodiment. The overall configuration of the fourth embodiment is substantially the same as that of the second embodiment. However, in the fourth embodiment, the control in the string-based erase operation is different from that in the second embodiment.

In the second embodiment, the rise timings of gate voltages to be supplied to the respective select gate lines SGD and SGS of the strings are differentiated based on erase state depth information. In the fourth embodiment, voltage levels of gate voltages to be supplied to the respective select gate lines SGD and SGS of the strings are differentiated based on erase state depth information.

The process flows of FIGS. 12 and 13 are also employed in the fourth embodiment. The fourth embodiment is different from the second embodiment in that in the string-based erase operation, the gate voltages to be applied to the select gate transistors ST1 and ST2 are changed according to each string.

As illustrated in FIG. 18, in the string-based erase operation, first, the sequencer 27 controls the voltage generation circuit 28 to apply an erase voltage Vera to the source line CELSRC and the bit line BL. Next, the sequencer 27 simultaneously applies gate voltages for turning ON the select gate transistors ST1 and ST2 to the select gate lines SGD and SGS of each string. In this case, the sequencer 27 controls the SG driver 28A of the voltage generation circuit 28 to supply gate voltages based on erase state depth information, to the select gate lines SGD and SGS of each string.

Depending on a voltage difference between the gate voltage of the select gate line SGD, and the voltage (that is, the erase voltage Vera) of the bit line BL, the conductive state of the select gate transistor ST1 is controlled and the amount of holes generated in the channel is changed. Depending on a voltage difference between the gate voltage of the select gate line SGS, and the voltage (that is, the erase voltage Vera) of the source line CELSRC, the conductive state of the select gate transistor ST2 is controlled and the amount of holes generated in the channel is changed. That is, the larger the voltage difference between the voltage of the select gate line SGD and the erase voltage Vera of the bit line BL and the voltage difference between the voltage of the select gate line SGS and the erase voltage Vera of the source line CELSRC, the larger the amount of the generated holes, and thus the erase state is likely to be deepened. Therefore, for the string having a shallower erase state, the gate voltages to be supplied to SGD and SGS of the corresponding string are reduced, and for the string having a deeper erase state, the gate voltages to be supplied to SGD and SGS of the corresponding string are raised.

FIG. 18 illustrates an example where the order of the erase state depth from the shallow side to the deep side is the String2, String1, String3, String0, and String4. In this case, as illustrated in FIG. 18, the SG driver 28A applies the lowest level of gate voltages to the select gate lines SGD2 and SGS2 that supply gate voltages to the select gate transistors ST1 and ST2 of the String2. The SG driver 28A applies gate voltages higher than the gate voltages applied to the select gate lines SGD2 and SGS2 respectively as gate voltages for turning ON the select gate transistors ST1 and ST2 of the String1, to the select gate lines SGD1 and SGS1. Likewise, assuming that gate voltages to be applied to the respective select gate lines SGD0 to SGD4 of the String0 to String4 are VSGD0 to VSGD4, respectively, and gate voltages to be applied to the respective select gate lines SGS0 to SGS4 of the String0 to String4 are VSGS0 to VSGS4, respectively, the SG driver 28A supplies gate voltages having the relationship VSGD2<VSGD1<VSGD3<VSGD0<VSGD4 to the select gate lines SGD2, SGD1, SGD3, SGD0, and SGD4, and supplies gate voltages having the relationship VSGS2<VSGS1<VSGS3<VSGS0<VSGS4 to the select gate lines SGS2, SGS1, SGS3, SGS0, and SGS4.

As a result, the amount of holes in the channel increases in the order of the String2, String1, String3, String0, and String4, and then the erase state is likely to be deepened in this order. Thus, regardless of characteristics of erase state depths in the strings, through the string-based erase operation, erase state depths are likely to be uniform in the strings.

In the fourth embodiment, gate voltages having different levels are applied in the same order as the select gate transistors ST1 and the select gate transistors ST2, and the control of the erase state depth may be more reliably performed.

With the fourth embodiment, the same effect as that in the third embodiment may be obtained. The control effect on the erase state depth may be improved.

In the first to fourth embodiments and suitable combinations thereof, the application time and the voltage levels of gate voltages to be applied to the select gate transistors ST1 and ST2 may be controlled based on the erase state depth information.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a plurality of strings each including a first select transistor, a plurality of memory cell transistors, and a second select transistor connected in series;
a plurality of word lines each connected to memory cell transistors in a same position across the plurality of strings;
a bit line connected in common to a first end of each of the plurality of strings;
a source line connected in common to a second end of each of the plurality of strings; and
a control circuit configured to perform an erase operation on plurality of strings, wherein
the control circuit is configured to adjust, for each of the plurality of strings, either an application time of a first voltage applied to a gate of the first select transistor of the respective string in the erase operation or a voltage level of the first voltage applied to the gate of the first select transistor of the respective string in the erase operation.

2. The semiconductor storage device according to claim 1, wherein in the erase operation the control circuit is further configured to adjust, for each of the plurality of strings, either an application time of a second voltage applied to a gate of the second select transistor of the respective string in the erase operation or a voltage level of the second voltage applied to the gate of the second select transistor of the respective string in the erase operation.

3. The semiconductor storage device according to claim 2, wherein the control circuit increases the application time of the second voltage applied to the gate of the first select transistor during the erase operation for strings having shallower erase depths compared to strings having normal erase depths.

4. The semiconductor storage device according to claim 2, wherein the control circuit increases the voltage level of the second voltage applied to the gate of the first select transistor during the erase operation for strings having shallower erase depths compared to strings having normal erase depths.

5. The semiconductor storage device according to claim 1, wherein the control circuit increases the application time of the first voltage applied to the gate of the first select transistor during the erase operation for strings having shallower erase depths compared to strings having normal erase depths.

6. The semiconductor storage device according to claim 1, wherein the control circuit increases the voltage level of the first voltage applied to the gate of the first select transistor during the erase operation for strings having shallower erase depths compared to strings having normal erase depths.

7. The semiconductor storage device according to claim 1, wherein the control circuit is further configured to:
  detect a depth of an erase state for each of the strings, and
    store the detected depths of the erase states for each of the string in a register.

8. The semiconductor storage device according to claim 7, wherein detecting the depth of the erase state is performed by counting the number of memory cell transistors in each string whose threshold voltage is greater than or equal to a predetermined threshold voltage.

9. The semiconductor storage device according to claim 7, wherein detecting the depth of the erase state is performed by counting the number of memory cell transistors in each string whose threshold voltage is less than or equal to a predetermined threshold voltage.

10. A semiconductor storage device, comprising:
  a NAND-type memory cell array including a plurality of string units, each string unit having a plurality of strings each with a plurality of memory cells connected in series between a first select transistor and a second select transistor; and
  a sequencer configured to perform an erase operation the NAND-type memory cell array, wherein
  the sequencer is configured to adjust, for each of the plurality of strings in a string unit being erased, either an application time of a first voltage applied to a gate of the first select transistor of the respective strings in the erase operation or a voltage level of the first voltage applied to the gate of the first select transistor of the respective strings in the erase operation.

11. The semiconductor storage device according to claim 10, wherein in the erase operation the sequencer is further configured to adjust, for each of the plurality of strings, either an application time of a second voltage applied to a gate of the second select transistor of the respective strings or a voltage level of the second voltage applied to the gate of the second select transistor of the respective strings in the erase operation.

12. The semiconductor storage device according to claim 11, wherein the sequencer increases the application time of the second voltage applied to the gate of the first select transistor during the erase operation for strings having shallower erase depths compared to strings having normal erase depths.

13. The semiconductor storage device according to claim 11, wherein the memory controller increases the voltage level of the second voltage applied to the gate of the first select transistor during the erase operation for strings having shallower erase depths compared to strings having normal erase depths.

14. The semiconductor storage device according to claim 10, wherein the sequencer increases the application time of the first voltage applied to the gate of the first select transistor during the erase operation for strings having shallower erase depths compared to strings having normal erase depths.

15. The semiconductor storage device according to claim 10, wherein the sequencer increases the voltage level of the first voltage applied to the gate of the first select transistor during the erase operation for strings having shallower erase depths compared to strings having normal erase depths.

16. The semiconductor storage device according to claim 10, wherein the sequencer is further configured to:
  detect a depth of an erase state for each of the strings, and
    store the detected depths of the erase states for each of the string in a register.

17. A method of erasing data in a semiconductor storage device including a plurality of strings in string units, the method comprising:
  adjusting, for each of the plurality of strings in an erase operation, either an application time of a first voltage applied to a gate of a first select transistor of the respective string in the erase operation or a voltage level of the first voltage applied to the gate of the first select transistor of the respective string in the erase operation.

18. The method according to claim 17, wherein the adjusting of the application time or the voltage level of the first voltage is based on a previously determined erase depth for each string in the erase operation.

19. The method according to claim 17, further comprising:
  adjusting, for each of the plurality of strings in the erase operation, either an application time of a second voltage applied to a gate of a first select transistor of the respective string in the erase operation or a voltage level of the second voltage applied to the gate of the second select transistor of the respective string in the erase operation.

20. The method according to claim 19, wherein the adjusting of the application time or the voltage level of the second voltage is based on a previously determined erase depth for each string in the erase operation.

* * * * *